US010403836B2

(12) United States Patent
Yang et al.

(10) Patent No.: US 10,403,836 B2
(45) Date of Patent: Sep. 3, 2019

(54) SEQUENTIAL PROCESSING WITH VAPOR TREATMENT OF THIN FILMS OF ORGANIC-INORGANIC PEROVSKITE MATERIALS

(71) Applicant: The Regents of the University of California, Oakland, CA (US)

(72) Inventors: Yang Yang, Los Angeles, CA (US); Qi Chen, Los Angeles, CA (US); Huanping Zhou, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 311 days.

(21) Appl. No.: 15/036,023

(22) PCT Filed: Nov. 12, 2014

(86) PCT No.: PCT/US2014/065273
§ 371 (c)(1),
(2) Date: May 11, 2016

(87) PCT Pub. No.: WO2015/116297
PCT Pub. Date: Aug. 6, 2015

(65) Prior Publication Data
US 2016/0285021 A1 Sep. 29, 2016

Related U.S. Application Data

(60) Provisional application No. 61/903,278, filed on Nov. 12, 2013.

(51) Int. Cl.
*H01L 51/42* (2006.01)
*B05D 1/00* (2006.01)
*H01L 51/00* (2006.01)

(52) U.S. Cl.
CPC ............ *H01L 51/4226* (2013.01); *B05D 1/60* (2013.01); *H01L 51/0003* (2013.01);
(Continued)

(58) Field of Classification Search
CPC ............ H01L 51/4226; H01L 51/0003; H01L 51/0004; H01L 51/0097; B05D 1/60
(Continued)

(56) References Cited

U.S. PATENT DOCUMENTS 5,871,579 A 2/1999 Liang et al.
6,344,662 B1 2/2002 Dimitrakopoulos et al.
(Continued)

FOREIGN PATENT DOCUMENTS

JP 2009-006548 A 1/2009

OTHER PUBLICATIONS

Abrusci et al., "High-Performance Perovskite-Polymer Hybrid Solar Cells via Electronic Coupling with Fullerene Monolayers," Nano Lett. 12: 3124-3128 (2013).
(Continued)

*Primary Examiner* — Jayne L Mershon
(74) *Attorney, Agent, or Firm* — Venable LLP; Henry J. Daley; Laura G. Remus

(57) ABSTRACT

According to some embodiments of the present invention, a method of producing an organic-inorganic perovskite thin film includes depositing a layer of inorganic material on a substrate to form an inorganic film, and performing an organic vapor treatment of the inorganic film to produce an organic-inorganic perovskite thin film. The layer of inorganic material comprises an inorganic anion layer having a metal-ligand framework, and the organic vapor treatment provides organic cations capable of becoming inserted into the metal-ligand framework of the inorganic anion layer to form a perovskite structure.

23 Claims, 16 Drawing Sheets

(52) U.S. Cl.
CPC ...... *H01L 51/0004* (2013.01); *H01L 51/0097* (2013.01); *H01L 51/0005* (2013.01); *Y02E 10/549* (2013.01); *Y02P 70/521* (2015.11)

(58) Field of Classification Search
USPC ........................................................ 136/255
See application file for complete search history.

(56) References Cited

U.S. PATENT DOCUMENTS

| | | | |
|---|---|---|---|
| 2002/0006733 A1* | 1/2002 | Noguchi | C30B 23/02 438/728 |
| 2002/0124790 A1 | 9/2002 | Era | |
| 2003/0170918 A1* | 9/2003 | Dehaven | H01L 51/0002 438/3 |
| 2012/0126216 A1 | 5/2012 | DeHaven et al. | |
| 2015/0249170 A1* | 9/2015 | Snaith | H01L 51/422 136/256 |

OTHER PUBLICATIONS

Baikie et al., "Synthesis and crystal chemistry of the hybrid perovskite (CH3NH3)PbI3 for solid-state sensitised solar cell applications," J. Mater Chem. A, 1: 5628-5641 (2013).
Ball et al., "Low-temperature processed meso-superstructured to thin-film perovskite solar cells," Energ. Environ. Sci., 6: 1739-1743 (2013).
Burschka et al., "Sequential deposition as a route to high-performance perovskite-sensitized solar cells," Nature, 499: 316-319 (2013).
Eperon et al., "Morphological Control for High Performance, Solution-Processed Planar Heterojunction Perovskite Solar Cells," Adv. Func. Mater, 24: 151-157 (2014).
Era et al., "Self-Organized Growth of PbI-Based Layered Perovskite Quantum Well by Dual-Source Vapor Deposition," Chem. Mater 9: 8-10 (1997).
Etgar et al., "Mesoscopic CH3NH3PbI3/TiO2 Heterojunction Solar Cells," J. Am. Chem. Soc. 134: 17396-17399 (2012).
Heo et al., "Efficient inorganic-organic hybrid heterojunction solar cells containing perovskite compound and polymeric hole conductors," Nat. Photon. 7: 486-491 (2013).
Im et al., "6.5% efficient perovskite quantum-dot-sensitized solar cell," Nanoscale, 3: 4088-4093 (2011).
Jeng et al., "CH3NH3PBI3 Perovskite/Fullerene Planar-Heterojunction Hybrid Solar Cells," Adv. Mater 25: 3727-3732 (2013).
Kagan et al., "Organic-Inorganic Hybrid Materials as Semiconducting Channels in Thin-Film Field-Effect Transistors," C. Science 286: 945-947 (1999).
Kim et al., "Lead Iodide Perovskite Sensitized All-Solid-State Submicron Thin Film Mesoscopic Solar Cell with Efficiency Exceeding 9%," Sci. Rep. 2: 591, 9 pages (2012).

Kim et al., "High Efficiency Solid-State Sensitized Solar Cell-Based on Submicrometer Rutile TiO2 Nanorod and CH3NH3PBI3 Perovskite Sensitizer," Nano Lett. 13: 2412-2417 (2013).
Kim et al., "Mechanism of carrier accumulation in perovskite thin-absorber solar cells," Nat. Commun. 2013, 4, 2242, 7 pages (2013).
Kojima et al., "Organometal Halide Perovskites as Visible-Light Sensitizers for Photovoltaic Cells," J. Am. Chem. Soc. 131: 6050-6051 (2009).
Laban et al., "Depleted hole conductor-free lead halide iodide heterojunction solar cells," Energ. Environ. Sci. 6: 3249-3253 (2013).
Lee et al., "Efficient Hybrid Solar Cells Based on Meso-Superstructured Organometal Halide Perovskites," Science 338: 643-647 (2012).
Liang et al., "Synthesis and Characterization of Organic-Inorganic Perovskite Thin Films Prepared Using versatile Two-Step Dipping Technique," Chem. Mater, 10: 403-411 (1998).
Liu et al., "Efficient planar heterojunction perovskite solar cells by vapour deposition," Nature 2013, 501, 395.
Mitzi et al., "Hybrid Field-Effect Transistor Based on a Low-Temperature Melt-Processed Channel Layer," Adv. Mater 14(23): 1772-1776 (2002).
Mitzi et al., "Thin Film Deposition of Organic-Inorganic Hybrid Materials Using a Single Source Thermal Ablation Technique," Chem. Mater. 11: 542-544 (1999).
Noh et al., "Chemical Management for Colorful, Efficient, and Stable Inorganic-Organic Hybrid Nanostructured Solar Cells," Nano Lett. 13: 1764-1769 (2013).
Park et al., "Organometal Perovskite Light Absorbers Toward a 20% Efficiency Low-Cost Solid-State Mesoscopic Solar Cell," Phys. Chem. Lett. 4: 2423-2429 (2013).
Snaith, "Perovskites: The Emergence of a New Era for Low-Cost, High-Efficiency Solar Cells," Phys. Chem. Lett. 4: 3623-3630 (2013).
Stoumpos et al., "Semiconducting Tin and Lead Iodide Perovskites with Organic Cations: Phase Transitions, High Mobilites, and Near-Infrared Photoluminescent Properties," Inorg. Chem. 52: 9019-9038 (2013).
Stranks et al., "Electron-Hole Diffusion Lengths Exceeding 1 Micrometer in an Organometal Trihalide Perovskite Absorber," Science 342: 341-344 (2013).
Sun et al., "The origin of high efficiency in low-temperature solution-processable bilayer organometal halide hybrid solar cells," Energy Environ. Sci. 7: 399-407 (2014).
Thompson, "Structure Evolution During Processing of Polycrystalline Films," Annu. Rev. Mater Sci. 30: 159-90 (2000).
Xing et al., "Long-Range Balanced Electron- and Hole-Transport Lengths in Organic-Inorganic CH3NH3PbI3," Science 2013, 342: 344-347 (2013).
Zhang et al., "Enhancement of Perovskite-Based Solar Cells Employing Core-Shell Metal Nanoparticles," Nano Lett. 13: 4505-4510 (2013).
Zhao et al., "Charge Transport and Recombination in Perovskite (CH3NH3)PBI3," J. Phys. Chem. Lett. 4: 2880-2884 (2013).

* cited by examiner

SEQUENTIAL PROCESSING WITH VAPOR TREATMENT OF THIN FILMS OF ORGANIC-INORGANIC PEROVSKITE MATERIALS

CROSS-REFERENCE OF RELATED APPLICATION

This is a national stage application under 35 U.S.C. § 371 of PCT/US2014/065273 filed Nov. 12, 2014, the entire contents of which are incorporated herein by reference, and this application claims priority to U.S. Provisional Application No. 61/903,278 filed Nov. 12, 2013, the entire content of which is hereby incorporated by reference.

This invention was made with Government support under Grant No. ECCS-1202231, awarded by the National Science Foundation, and Grant No. FA9550-12-1-0074, awarded by the Air Force Office of Scientific Research. The Government has certain rights in the invention.

BACKGROUND

1. Technical Field

The field of the currently claimed embodiments of this invention relates to a process for preparing an organic-inorganic hybrid material thin film and a method of preparing opto-electrical devices including a melt-processed organic-inorganic perovskite material. Particularly, the currently claimed embodiments of this invention relate to a process for preparing perovskite material thin film based devices including solar cells, lasers, field-effect transistors (FETs), light-emitting diodes (LEDs), radiation detectors, sensors, and superconductors.

2. Discussion of Related Art

Organic-inorganic hybrid materials, particularly including materials of the perovskite family, represent an alternative class of materials that may combine desirable physical properties characteristic of both organic and inorganic components within a single molecular-scale composite. Organic-inorganic hybrid materials have applications in photovoltaics and field-effect transistors, and also have potential to be incorporated into lasers, light-emitting diodes, and other sensors, such as radiation detectors.

Henry Snaith has demonstrated incorporation of lead(II) based perovskite solar cells via vacuum deposition achieving a photoelectric conversion efficiency (PCE) over 15%. Chondroudis et al. and C. R. Kagan et al. describe integrating the self-assembling nature of organic materials with the high carrier motilities characteristic of inorganic materials for possible use in organic-inorganic FETs (OIFETs). The high carrier mobility of layered organic-inorganic perovskites based on a tin(II) iodide framework suggests that they be used as channel materials for FETs. K. Chondroudis et al. describe single crystals and thin films of the hybrid perovskites that can be employed in OILEDs.

A low cost, environmental friendly method of producing organic-inorganic hybrid materials that can be implemented on a large scale is needed. Currently, the organic-inorganic perovskite materials have been processed to be crystals or thin films by conventional methods including solution-based or evaporative techniques. However, the vacuum processing methods currently used for forming a continuous perovskite film with micron or sub-micron grain size and a smooth surface are high cost methods that generally require the use of environmentally hazardous solvents. Therefore there remains a need for improved methods of processing hybrid perovskite materials, as well as devices that incorporate the materials.

SUMMARY

According to some embodiments of the present invention, a method of producing an organic-inorganic perovskite thin film includes depositing a layer of inorganic material on a substrate to form an inorganic film, and performing an organic vapor treatment of the inorganic film to produce an organic-inorganic perovskite thin film. The layer of inorganic material comprises an inorganic anion layer having a metal-ligand framework, and the organic vapor treatment provides organic cations capable of becoming inserted into the metal-ligand framework of the inorganic anion layer to form a perovskite structure.

According to some embodiments of the present invention, an organic-inorganic perovskite thin film includes a substrate, an inorganic component deposited on the substrate to form an inorganic thin film, and an organic component for treating the inorganic thin film. The inorganic component comprises an inorganic anion layer having a metal-ligand framework, and the organic component comprises organic cations that become inserted into the metal-ligand framework of the inorganic component to form a perovskite structure.

According to some embodiments of the present invention, an electronic or electro-optic device includes an organic-inorganic perovskite thin film. The organic-inorganic perovskite thin film includes a substrate, an inorganic component deposited on the substrate to form an inorganic thin film, and an organic component for treating the inorganic thin film. The inorganic component has a metal-ligand framework, and the organic component comprises organic cations that become inserted into the metal-ligand framework of the inorganic component to form a perovskite structure.

According to some embodiments of the present invention, a system for producing an organic-inorganic perovskite thin film includes a deposition component, and an organic vapor treatment component. The deposition component is configured to deposit a layer of inorganic material on a substrate to form an inorganic film, and the inorganic material comprises an inorganic anion layer having a metal-ligand framework. The organic vapor treatment component is configured to perform an organic vapor treatment of the inorganic film, and the organic vapor treatment provides organic cations capable of becoming inserted into the metal-ligand inorganic anion layer to form a perovskite structure.

BRIEF DESCRIPTION OF THE DRAWINGS

Further objectives and advantages will become apparent from a consideration of the description, drawings, and examples.

DETAILED DESCRIPTION

Figure 1:
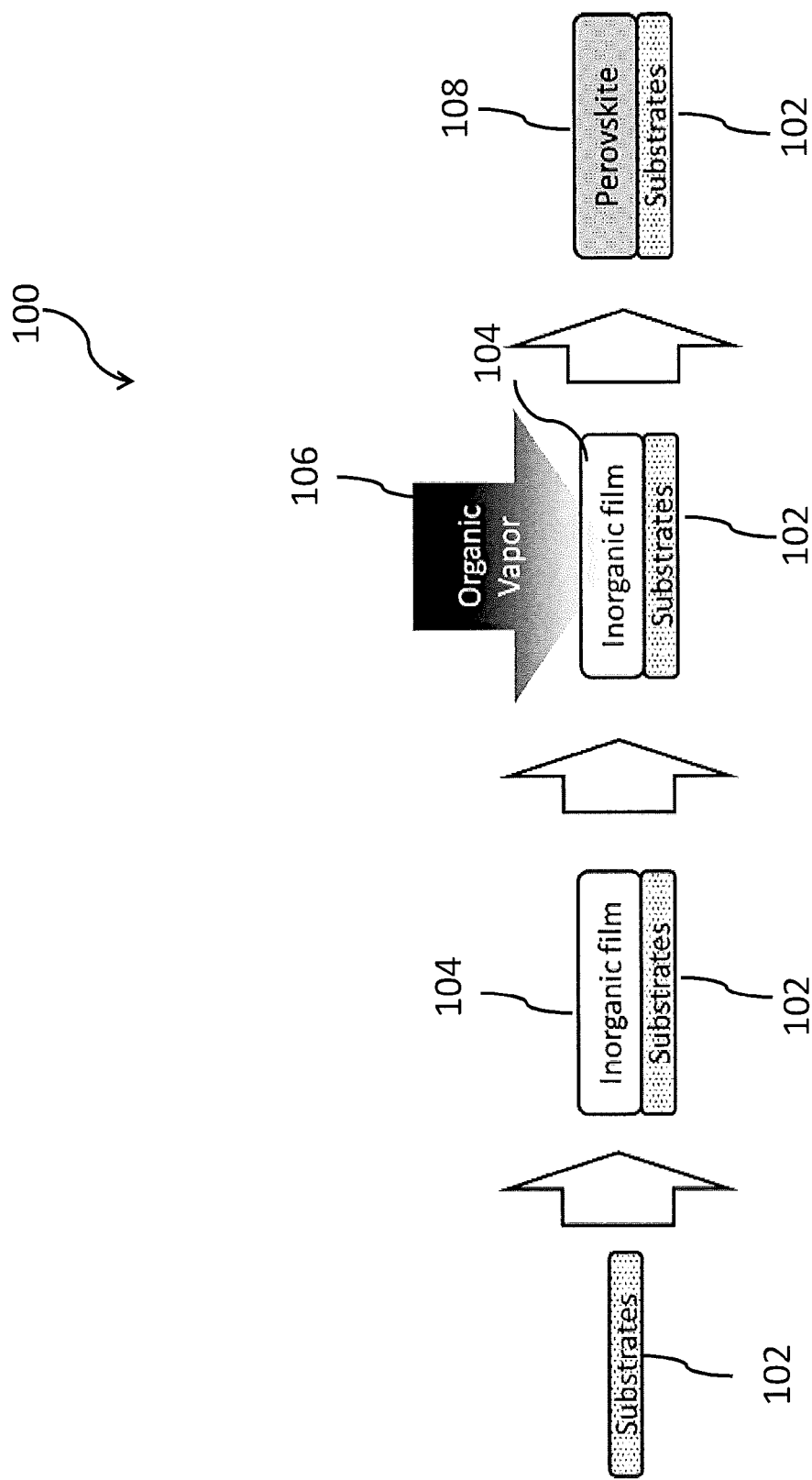
FIG. 1 is a schematic illustration of sequential processing with vapor treatment for fabrication of a perovskite thin film.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

Recently, organometal halide perovskite materials (e.g. $CH_3NH_3PbI_3$) have been highlighted as one of the most competitive candidates as the absorber materials for thin film photovoltaic (PV) applications.[1,2] The perovskite solar cells have already been reported to achieve the remarkable high efficiency of around 15% within recent 4 years.[3,4] The reason to the rapidly boosted power conversion efficiency (PCE) of such devices is that this perovskite materials possess most properties that are required to be an excellent absorber: appropriate direct bandgap, high absorption coefficient, excellent carrier transport, and apparent tolerance of defects.[2] Beside of its extremely low cost and ease of fabrication, the organometal perovskite materials possess unique chemical structure: it consists of layered structure where a two dimensional layer of metal halide and an organic layer are alternately stacked. Pioneering work has suggested that these perovskite films exhibit structural dependent properties, which can be accessed by various processing approaches.[5,6] Thus, it is essential to achieve a fine controllability over the reaction between the inorganic and organic species, resulting in perovskites with desired properties and device performance.

Although they were first implemented in dye-sensitized solar cells based on mesoporous structures,[7-15] the perovskites have gradually been found to assume all of the principal roles of PV operations,[16-22] and PV devices with planar architecture have been demonstrated.[4,23-25] Planar architecture potentially provides enhanced flexibility for device optimization, multi-junction construction and investigation of the underlying device physics, but it requires tremendous efforts to fabricate high quality perovskite films. Similar to other thin film PV technologies (e.g. α-Si, Cu(In-Ga)S₂ and CdTe), vacuum evaporation is one of the most promising technique to construct perovskite thin film for planar junction. The resulting perovskites by co-evaporation of two precursors ($PbCl_2$ and $CH_3NH_3I$) exhibits satisfied film coverage and uniformity within expectations.[4] However, this technique demands high vacuum, which is too energy consuming to hinder mass production. Alternatively, solution process techniques are proposed to fabricate thin films as well, where the mixture of two precursors was used. Due to the lack of desired solvents with good solvability to both components and the extremely high growth rate of perovskite however, it resulted in thin films with pinhole formation and moderate surface coverage, which deteriorated the film quality and hampered the device performance.[23] The two-step approach has been demonstrated to fabricate efficient PV devices by dipping the inorganic precursor films into the solution of organic species.[3] Unfortunately, this method receives success limited in films with nano-structuring scaffolds,[3] but has seldom reported to be applicable for fabricating planar heterojunction in PV devices. Constructing the $CH_3NH_3PbI_3$ film with the thickness of several hundred nanometers requires long reaction time due to the limited reaction interface area. Often it resulted in the film with strikingly enhanced surface roughness, and ultimately peeling off from the substrate.[26] As such, there is an urge to develop a facile solution approach for perovskite materials with enhanced controllability on the film quality to construct planar structured devices with competitive performance.

An embodiment of the present invention provides a low temperature method for preparing an organic-inorganic perovskite material thin film. It includes sequential steps: 1) solution processing of inorganic components to form the thin films on the desired substrates and 2) vapor treatment of the as-prepared thin films to form the organic-inorganic perovskite materials in situ.

Accordingly, an embodiment of the present invention can provide low-cost processed high quality organic-inorganic hybrid materials, which can be used in a variety of applications, including photovoltaics, flat panel displays, non-linear optical/photoconductive devices, chemical sensors, radiation sensors, emitting and charge transporting layers in organic-inorganic light-emitting diodes, channel layers in organic-inorganic FETs, and superconductors.

These and other objects of the present invention will become apparent by exploiting other related or novel perovskite materials and the methods and systems for preparing those perovskite materials.

Organic-inorganic perovskite materials are a distinct class of materials that enable the combination of the useful characteristics of organic and inorganic components within a single material. Some members of this class of materials exhibit semiconducting characteristics. Layered perovskites may naturally form a quantum well structure in which a two-dimensional semiconductor layer of corner sharing metal halide octahedra and an organic layer are alternately stacked. Both the organic components and the inorganic components can be mixed together on a molecular level in a substantially fixed ratio, enabling a self-assembly into a predictable arrangement.

For preparation of such organic-inorganic hybrid materials, solution processing can be a low cost, facile approach. However, despite the convenience of solution-processing, potential problems with poor solubility and surface wetting, chemical incompatibility between the solvent and hybrid materials, and less desired surface energy for crystal growth of hybrid materials limit the application of these techniques. It is therefore essential to consider other possibilities for film processing, with a special emphasis on those techniques that are compatible with a range of substrate materials and various application requirements.

An embodiment of the present invention can provide a process for low temperature fabrication of organic-inorganic perovskite materials thin films. It includes the following steps, illustrated in the process 100 in FIG. 1. First, inorganic components are deposited on the desired substrate 102 to form a thin film framework 104. The inorganic components may be deposited by spin-coating an inorganic component solution, via growth using chemical vapor deposition (CVD)/metal organic CVS (MOCVD), by thermal vacuum deposition, or by electron beam deposition of the inorganic compound. Second, the inorganic film 104 is treated with the vapor of organic components 106 at desired conditions to form the organic-inorganic perovskite solid films 108 in situ. The organic components can be placed in the vicinity of the inorganic films, or can be placed directly in contact with the inorganic films in different manners. Upon the reaction at certain temperature, the organic components diffuse into the inorganic films, and convert them into the inorganic/organic perovskite films in situ by chemical reactions.

The organic components are vaporized to react with the inorganic film, forming the inorganic-organic perovskite in situ. It is critical to select the temperature that generates sufficient vapor pressure without decomposing the organic components. For example, methylammounium iodide (MAI) may be used to fabricate the perovskite film according to an embodiment of the invention. The working temperature for introducing the MAI generally ranges from 100-150° C. Higher temperatures will decompose the MAI while lower temperatures will not provide sufficient vapor. The substrate's temperature also influences the perovskite formation. For the example of MAI described above, the temperature for the substrate will be approximately 120-180° C. Higher temperatures will cause the decomposition of the perovksite materials, while lower temperatures will not provide a sufficient reaction driving force. As such, besides using a confined space with coexistence of the inorganic film and the organic components, a two zone furnace which can fine tune the temperature of the substrate and the vapor may be used to perform the deposition. In addition, by carefully tuning the atmosphere of the furnace, un-desired side reactions can be excluded. The reaction may generally be performed in nitrogen, but if another vapor/gas is introduced it will dope the perovskite films. For example, if oxygen is present it will introduce some defects in the crystal, so that the resulting materials will have enhanced carrier concentration. Intentional doping may thus be achieved with a desired doping level.

The organic-inorganic perovskite thin film fabrication technique according to some embodiments of the current invention can form a continuous organic-inorganic hybrid material film with up to 100% surface coverage. It can be preferable for an organic-inorganic perovskite material to be a polycrystalline material having a grain size equal to or greater than the dimensions between contacts in a device. It can be preferred to form the inorganic component thin film with good surface coverage and small surface roughness.

As such, suitable organic-inorganic perovskite materials can include, but are not limited to, an inorganic anion layer having a metal-ligand framework, and an organic cation layer having an organic cation capable of inserting into the metal-ligand inorganic anion layers within the perovskite structure. The organic components can include, but are not limited to, the species with lower melting points, such as $CH_3NH_3I$, $CH_3NH_3Br$, and $CH_3NH_3Cl$. The inorganic films fabrication methods can include, but are not limited to, spin-coating, spray-coating, dip-coating, and/or inkjet printing.

The inorganic frameworks can include, but are not limited to, metal halides, metal tetrafluoroborate, metal hexafluorophosphorate, and metal thiocyanate. The metals for the inorganic-organic hybrid can include, but are not limited to, bivalent metals, such as the group (IV) metals, transition metals, rare earth metals, or trivalent metals such as Bi, Sb, and their combinations. The organic components being evaporated can include, but are not limited to, compounds or the combination of compounds with lower melting points, such as alkyl ammonium halide, e.g. CH3NH3X, where X stands for halide; or other organic compounds, e.g. (NH2C(I)=NH2)2(CH3NH3)nXn+2 with n=1, 2, . . . ∞; (RNH3)2(CH3NH3)n−1Xn+1 with R=butyl, phenethyl; n=1, 2 . . . ∞, where X stands for halide or tetrafluoroborate, hexafluorophosphorate, and thiocyanate.

Various substrates can be employed, such as, but not limited to, fluorine doped tin oxide (FTO), indium tin oxide (ITO), silicon, metal, oxides, polymers, etc. The flexibility in the chemistry and processing of organic-inorganic hybrid materials can facilitate incorporating perovskites into different devices, such as multi-junction solar cells, both n- and p-type transporting materials in thin-film transistors (TFTs), LEDs, sensors, and superconductors. Flexible substrates can be used to make flexible electronics.

Figure 2:
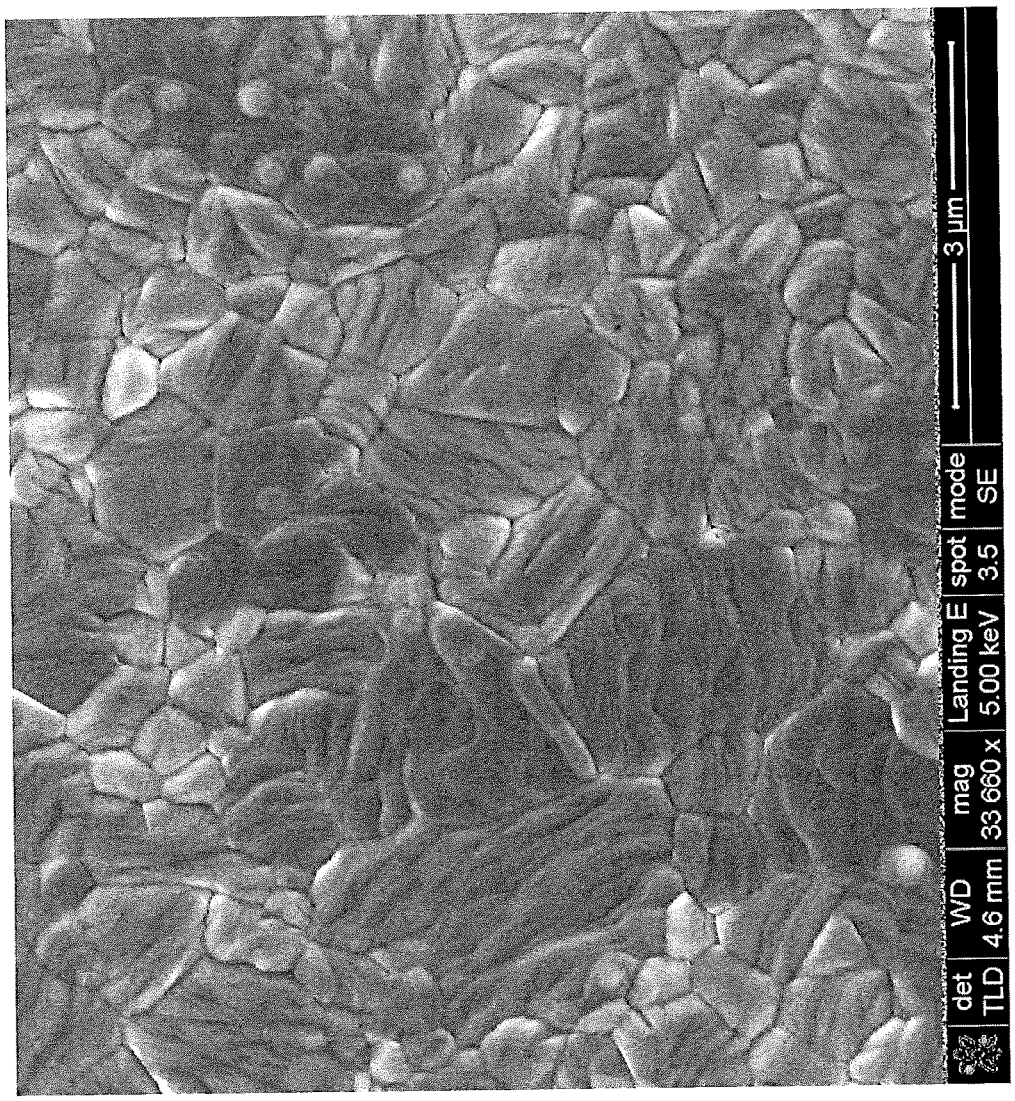
FIG. 2 is a scanning electron microscope (SEM) image of a $CH_3NH_3PbI_3$ perovskite thin film deposited on SiO2 substrates according to an embodiment of the invention.
Figure 3:
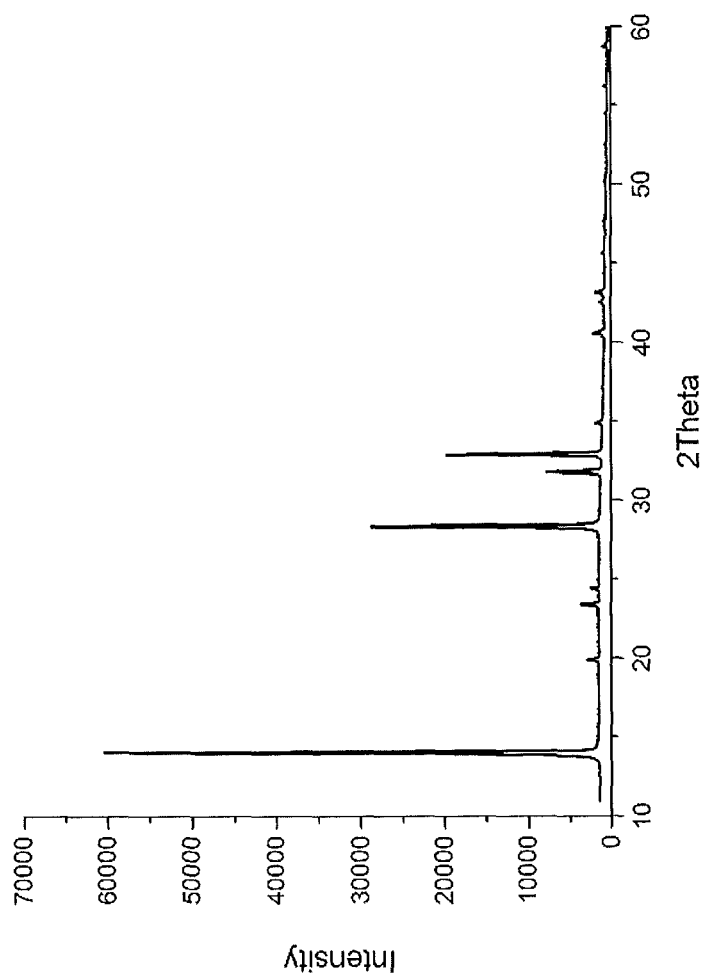
FIG. 3 shows an X-ray diffraction (XRD) pattern of a $CH_3NH_3PbI_3$ perovskite thin film deposited on SiO2 substrates according to an embodiment of the invention.
Figure 4:
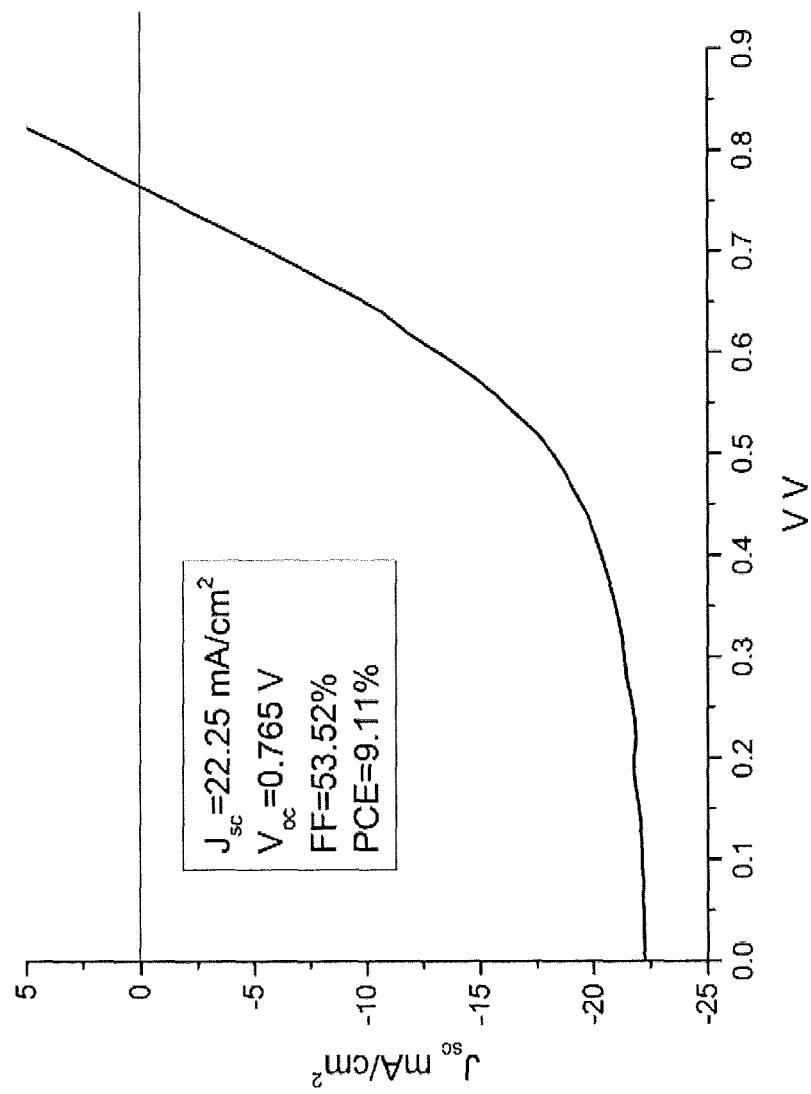
FIG. 4 shows a current density-voltage (J-V) curve of a CH₃NH₃PbI₃ perovskite based solar cell with an active layer fabricated according to the methods described herein.

As an example, $CH_3NH_3PbI_3$ perovskite thin films with thicknesses up to several micro-meters were fabricated via this method. Different substrates were employed, such as FTO, ITO, PSS:PEDOT, TiO2, SiO2, Si and ZnO2, for example. FIG. 2 shows a scanning electron microscope (SEM) image of the deposited film on SiO2 substrates. FIG. 3 shows an X-ray diffraction (XRD) pattern of a $CH_3NH_3PbI_3$ perovskite thin film deposited on SiO2 substrates according to an embodiment of the invention. FIG. 4 shows a current-voltage (J-V) curve of a $CH_3NH_3PbI_3$ perovskite based solar cell with an active layer fabricated according to the methods described herein.

Figure 5:
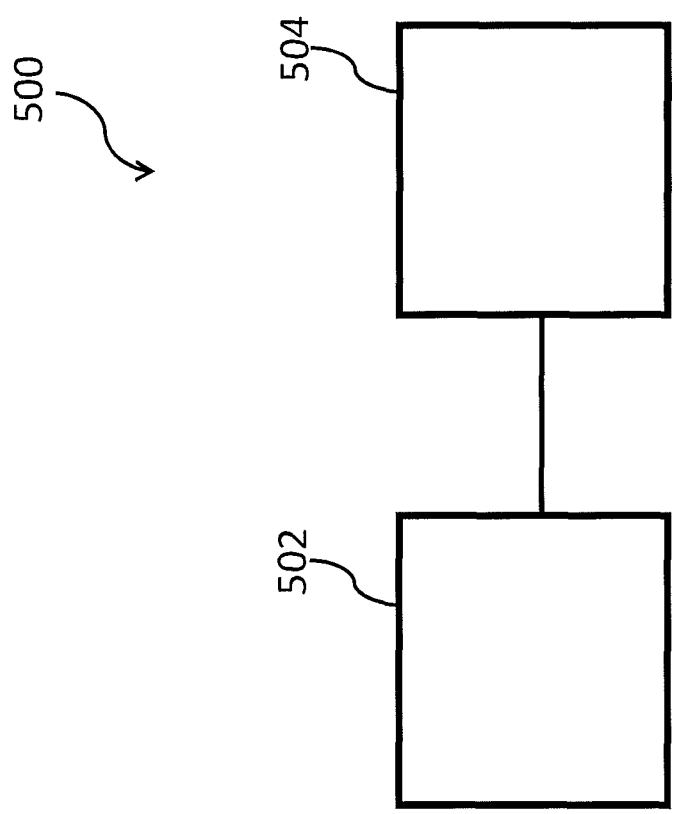
FIG. 5 shows a system for producing an organic-inorganic thin film according to some embodiments of the invention.

An embodiment of the present invention provides a system for producing an organic-inorganic hybrid thin film, illustrated in FIG. 5. The system 500 includes a deposition component 502 and an organic vapor treatment component 504. The deposition component 502 is configured to deposit a layer of inorganic material on a substrate to form an inorganic film. The inorganic material comprises an inorganic anion layer having a metal-ligand framework. The organic vapor treatment component 504 is configured to perform an organic vapor treatment of the inorganic film. The organic vapor treatment provides organic cations capable of becoming inserted into the metal-ligand inorganic anion layers to form a perovskite structure.

The vapor treatment of the as-deposited precursor film results in as-desired thin films. The thin films include but are not limited to organic-inorganic perovskite materials and other organic-inorganic hybrid materials with an inorganic component having a metal-ligand framework, and an organic (vapor) component capable of inserting into the metal-ligand inorganic framework. The inorganic frameworks include, but are not limited to, a metal halide, metal tetrafluoroborate, metal hexafluorophosphorate, and metal thiocyanate. The organic components being evaporated include, but are not limited to, a species with a lower melting point, such as $CH_3NH_3I$, $CH_3NH_3Br$, and $CH_3NH_3Cl$.

Figure 6:
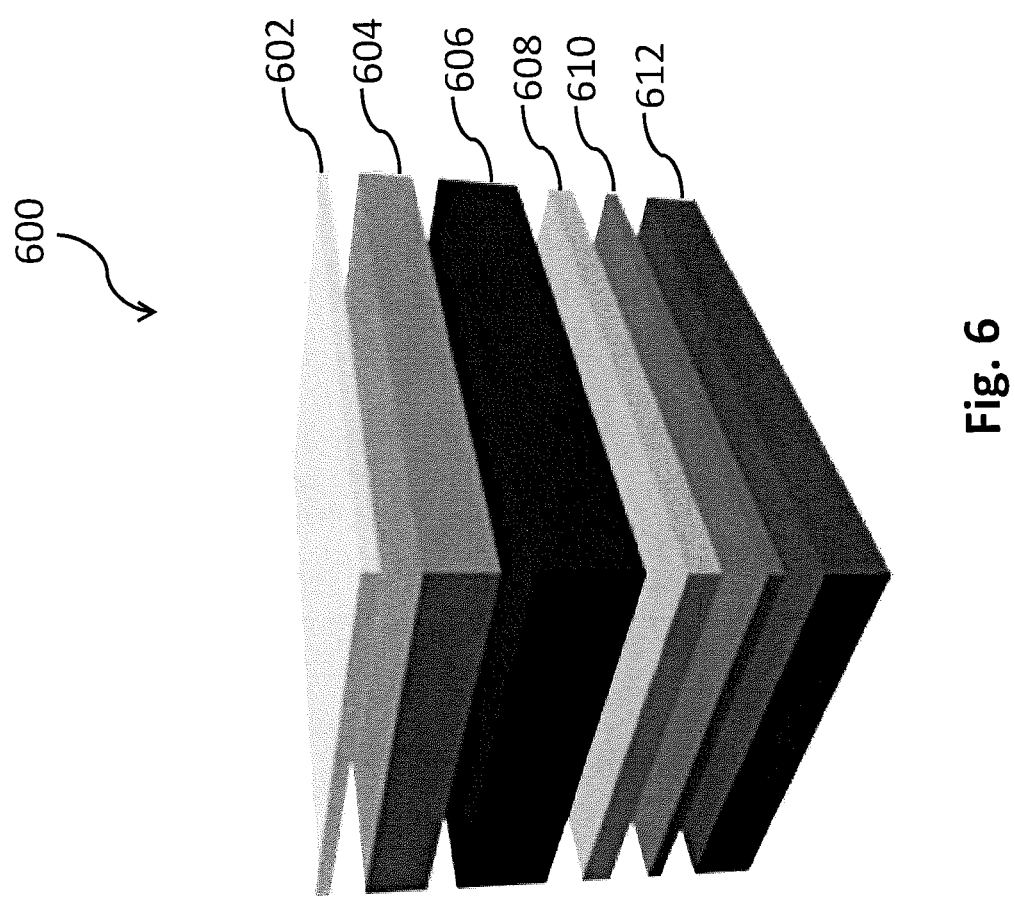
FIG. 6 shows a device architecture for a perovskite solar cell according to an embodiment of the invention.
Figure 7:
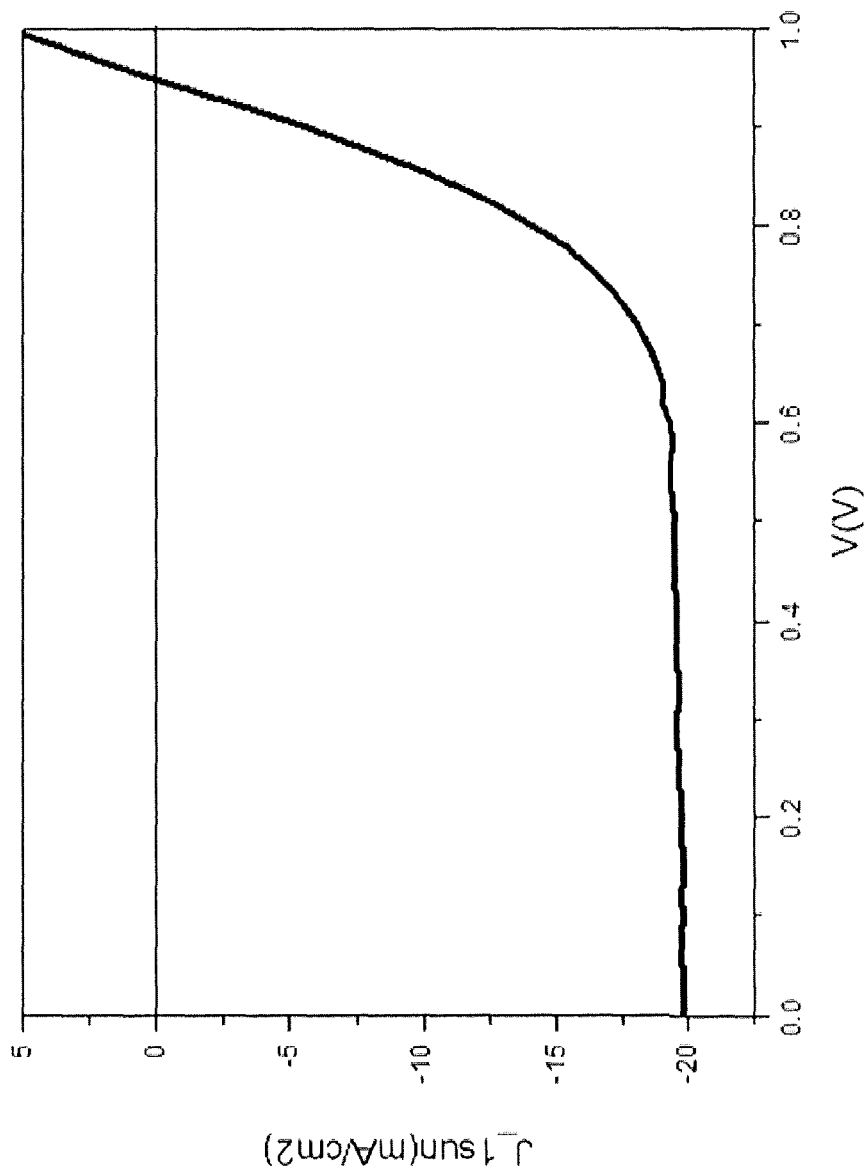
FIG. 7 shows a typical J-V curve for a perovskite solar cell.

The high quality of the resulting organic-inorganic hybrid materials film can be utilized in various applications, including, but not limited to, solar cells, multi junction solar cells, channel layers in TFTs, LEDs, lasers, FETs, sensors, radiation detectors and superconductors. Electronic or electro-optic devices using the organic-inorganic perovskite thin films may include a substrate that is at least one of flexible or stretchable; may include metal oxide carrier transport layers; and may include top electrodes. The organic-inorganic perovskite thin film, metal oxide carrier transport layers, and top electrodes may be fabricated via a low temperature process. The top electrodes may be transparent or semi-transparent resulting in visibly semi-transparent optoelectronic devices, such as solar cells, detectors, sensors. FIG. 6 shows a device architecture for a perovskite solar cell according to an embodiment of the invention. The solar cell 600 includes an electrode 602, a carrier transport layer 604, perovskite 606, a second carrier transport layer 608, a second electrode 610, and a substrate 612. FIG. 7 shows a J-V curve for a perovskite solar cell according to some embodiments of the invention, with efficiency of 12.65%.

The deposition methods for the precursor films can include, but are not limited to, spin-coating, spray-coating, dip-coating, inkjet printing, roll-to-roll coating, and vacuum coating. The inorganic components may be deposited on a variety of substrates, including, but not limited to FTO, ITO, silicon, metal, or oxides. The inorganic components may be deposited on flexible substrates, e.g., polymers, etc., to enable flexible electronics.

The following examples describe some embodiments in more detail. The broad concepts of the current invention are not intended to be limited to the particular examples.

EXAMPLES

The vapor assisted solution process (VASP) is demonstrated herein to fabricate perovskite thin films and PV devices with planar geometry subsequently. The process includes the film growth via the as-deposited film of $PbI_2$ in-situ reacting with $CH_3NH_3I$ vapor (FIG. 1). This method is conceptually different from either the current solution process or vacuum deposition, by avoiding the co-deposition of organic and inorganic species. It utilizes the kinetic reactivity of $CH_3NH_3I$ and thermodynamic stability of perovskite during the in-situ growth process, and provides the films with well-defined grain structure of the size up to micro-scale, full surface coverage, and small surface roughness, which suits PV applications. Devices based on films prepared via VASP have achieved best PCE of 12.1%.

Figures 8A, 8B, 8C, 8D:
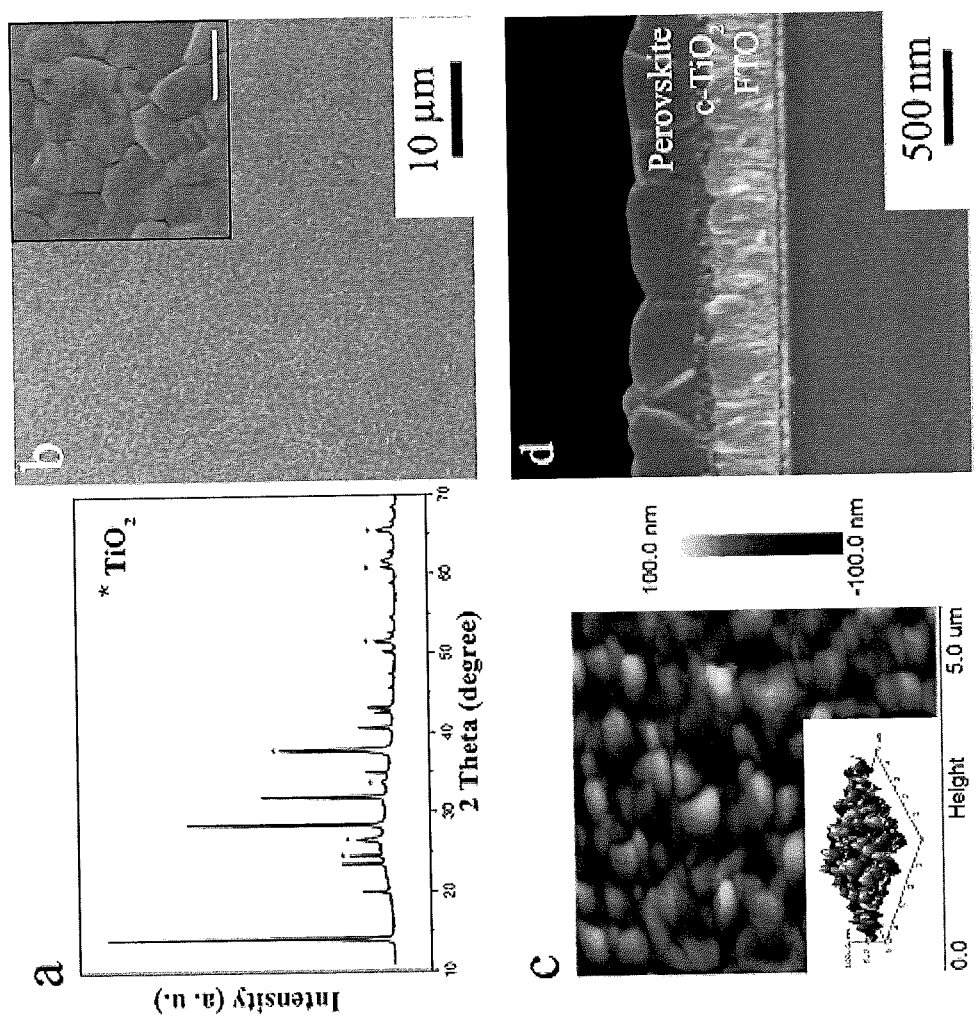
FIG. 8A shows an XRD pattern of the perovskite film on the FTO/c-TiO2 substrate, obtained from the reaction of the PbI2 film and CH3NH3I vapor at 150° C. for 2 h.
FIG. 8B shows a top-view SEM image (inset image with higher resolution, scale bar is 1 µm) of the perovskite film on the FTO/c-TiO2 substrate, obtained from the reaction of the PbI2 film and CH3NH3I vapor at 150° C. for 2 h.
FIG. 8C shows Tapping-mode AFM height images (5×5 µm) (Inset: the corresponding 3D topographic image) of the perovskite film on the FTO/c-TiO2 substrate, obtained from the reaction of the PbI2 film and CH3NH3I vapor at 150° C. for 2 h.
FIG. 8D shows a cross-sectional SEM image of the perovskite film on the FTO/c-TiO2 substrate, obtained from the reaction of the PbI2 film and CH3NH3I vapor at 150° C. for 2 h.

VASP was developed to fabricate organic-inorganic hybrid perovskite film (e.g. $CH_3NH_3PbX_3$, X=Cl, Br, I), where the inorganic framework film is formed by depositing precursor solution on the substrates, and subsequently treated with desired organic vapor (FIG. 1). As an illustration, $PbI_2$ and $CH_3NH_3I$ are the corresponding precursor couples to form $CH_3NH_3PbI_3$ in this work (see below for details). $PbI_2$ films were deposited on the fluorine-doped tin oxide (FTO) glass coated with a compact layer of $TiO_2$ (c-$TiO_2$), followed by annealed in $CH_3NH_3I$ vapor at 150° C. for 2 hours to form the perovskite films. FIG. 8A shows the corresponding X-ray diffraction (XRD) of the as-prepared $CH_3NH_3PbI_3$ film on FTO/c-$TiO_2$ substrate. A set of strong peaks appeared at 14.08°, 28.41°, and 31.85°, 43.19°, which are assigned to the (110), (220), (310) and (330) of $CH_3NH_3PbI_3$ crystal,[7,27,28] indicate an orthorhombic crystal structure of halide perovskite with highly crystallinity. According to the literature,[4] there is often a tiny signature peak at 12.65°, corresponding to negligible impurity of $PbI_2$. The absence of the aforementioned peak in the present perovskite film suggests a complete consumption of $PbI_2$ via VASP. The film quality of the perovskite is further evaluated by scanning electron microscopy (SEM) images and atomic force microscopy (AFM) characterization. As shown in FIG. 8B, the as-formed perovskite film possesses the characteristics of full surface coverage on the substrates, with remarkable grain size up to micro-scale. The surface roughness of the film was measured by AFM (FIG. 8C), and calculated to be 23.2 nm in the range of 5 μm×5 μm. The roughness of the film fabricated via VASP is relatively smaller comparing to other solution processed films,[26] regardless of its micro-scale grain size.

A typical cross-sectional SEM image, such as that shown in FIG. 8D, indicates the resulting film in a thickness of ~350 nm with the well-defined grains across the film thickness. The as-prepared film with 100% surface coverage, micro-scale grain size, and uniform grain structure suggest its promising applicability ready for PV devices. These overwhelming characteristics could be due to the combination of the relatively smoothness of the pre-formed $PbI_2$ film and the effective intercalation of $CH_3NH_3I$ vapor into the inorganic framework and fast reaction, as will be discussed later.

Film formation is crucial to fabricate planar heterojunctions in most thin film PV techniques, it is thus necessary to understand the underlying kinetic and thermodynamic mechanism of perovskite thin film fabrication via VASP. The investigation of perovskite thin film evolution was carried out by annealing ~200 nm thick $PbI_2$ film in the presence of $CH_3NH_3I$ at 150° C. with different duration time. Four representative samples with different annealing time were discussed: the initial stage (0 h, FIG. 9B), intermediate stage (0.5 h, FIG. 9C), complete stage (2 h, FIG. 8B), and post stage (4 h, FIG. 9D). The XRD pattern (FIG. 9A) clearly shows that at the initial stage, the film is composed of $PbI_2$ phase, while in the intermediate stage, both phases of $PbI_2$ and perovskite co-existing in the film as the appearance of their corresponding peaks, respectively. With time evolution, the $PbI_2$ phase disappears at the complete stage, and no new peak is observed at the post stage.

Figures 9A, 9B, 9C, 9D:
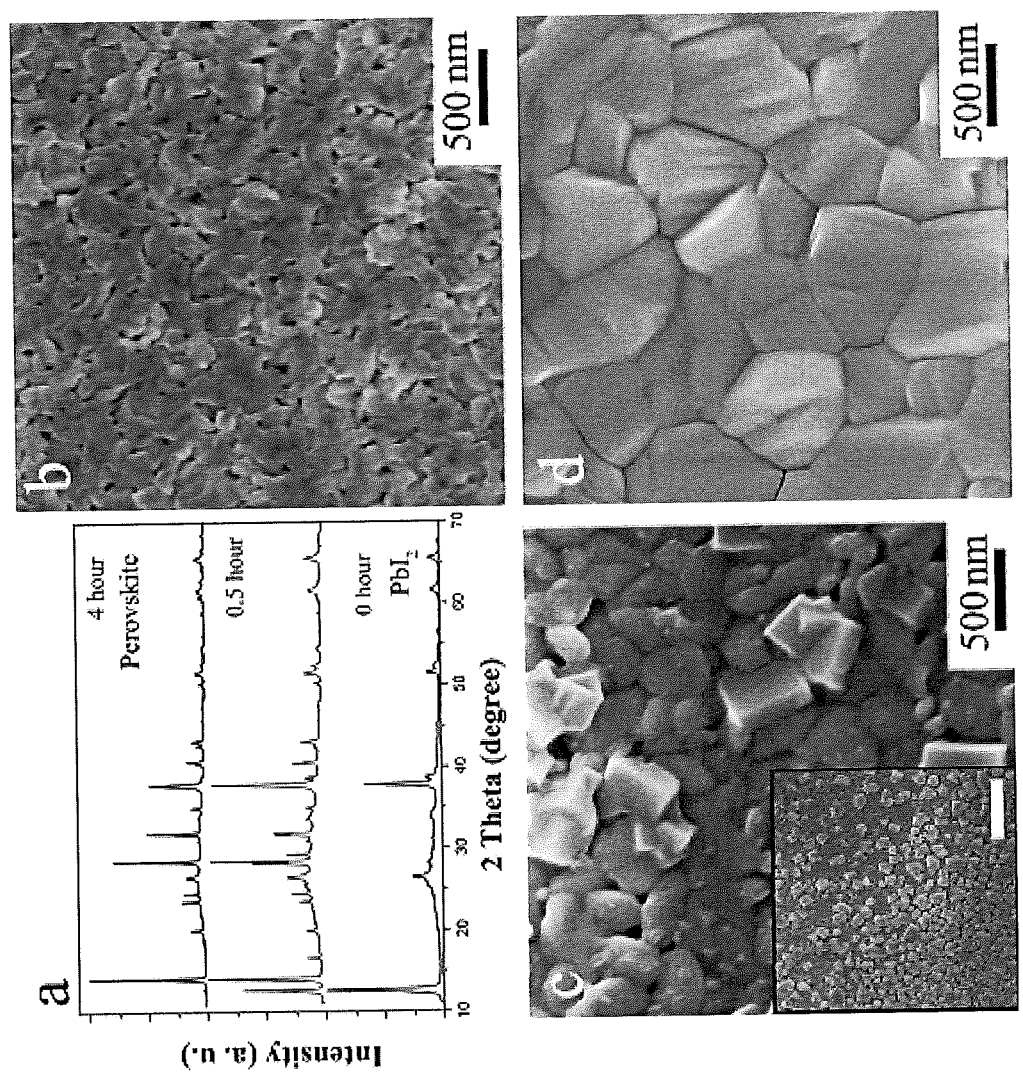
FIG. 9A shows XRD patterns of ~200 nm PbI₂ film annealed in the presence of CH₃NH₃I at 150° C. at 0 h, 0.5 h, and 4 h respectively.
FIG. 9B shows a top-view SEM image of ~200 nm PbI₂ film annealed in the presence of CH₃NH₃I at 150° C. at 0 h.
FIG. 9C shows a top-view SEM image of ~200 nm PbI₂ film annealed in the presence of CH₃NH₃I at 150° C. at 0.5 h (inset: wider view, scale bar 3 µm)
FIG. 9D shows a top-view SEM image of ~200 nm PbI₂ film annealed in the presence of CH₃NH₃I at 150° C. at 4 h.
Figures 10A, 10B, 10C:
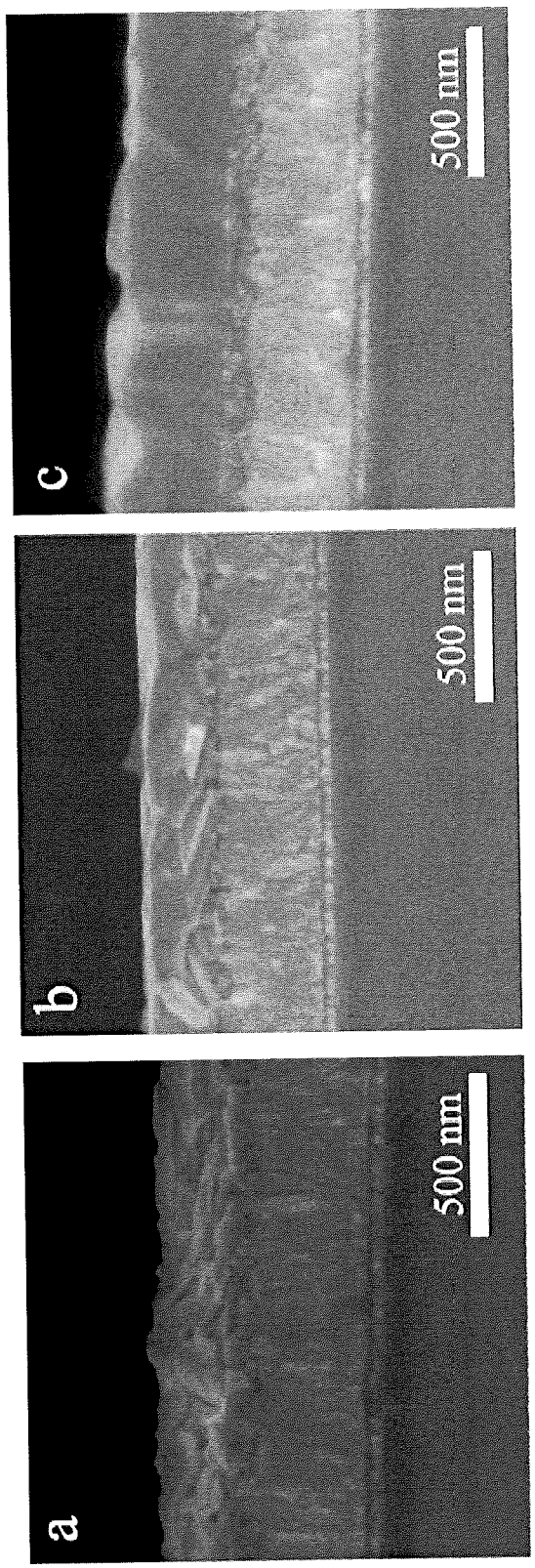
FIG. 10A shows a cross-sectional SEM image of a PbI₂ film annealed at 150° C. for 0 h in the presence of CH₃NH₃I.
FIG. 10B shows a cross-sectional SEM image of the PbI₂ film annealed at 150° C. for 0.5 h in the presence of CH₃NH₃I.
FIG. 10C shows a cross-sectional SEM image of the PbI₂ film annealed at 150° C. for 4 h in the presence of CH₃NH₃I.

The grain structure of the corresponding deposited film changes strikingly along with the intercalation reaction as well. FIGS. 10A-10C shows cross-sectional SEM images of the PbI2 film annealed at 150° C. for 0 h (FIG. 10A), 0.5 h (FIG. 10B), and 4 h (FIG. 10C) in the presence of CH3NH3I. The initial $PbI_2$ film exhibits the uniform polygon grain of a few hundred nanometers, accompanying with scattering voids among adjacent grains. As the $PbI_2$ film exposed in $CH_3NH_3I$ vapor for 30 minutes, it exhibited two distinct shapes with different contrast. The dark grains show the similar morphology as that in FIG. 9B, which is considered as the un-reacted $PbI_2$. The relatively light grains appeared right on the top of the original $PbI_2$ film with larger grain size and different grain morphology. As the coexistence of two phases in the film is confirmed by XRD pattern, they are speculated to be the newly formed perovskite. These species on the top of $PbI_2$ films significantly promote the film thickening, as shown in FIG. 10B, probably due to the volume expansion of the intercalation of $CH_3NH_3I$, accompanying with the transformation of $PbI_2$ framework from the originally edge sharing octahedral structure to the corner-sharing octahedral structure in perovskite films.[27] It is worth noting the appearance of some dots with the size of tens of nanometers on the surface of un-reacted $PbI_2$. It is highly suspected that these tiny dots are reactive "nuclei" for the growth of grains, originated from the reaction between $PbI_2$ and $CH_3NH_3I$ vapor. With the presence of the newly formed perovskite crystals on top, accompanying with the "nuclei" decorated around, we believe that the intercalation reaction took place on top of the $PbI_2$ film in this stage. As the reaction time increased to 2 h, the perovskite films with the grain size up to micro-scale have been observed. Compared to the original $PbI_2$ film, the perovskite film differs in both morphology and size, where the film thickness of perovskite increases to ~350 nm from the original $PbI_2$ film of ~200 nm (FIG. 10A). The in-plane grain size of perovskite is three-folded to the film thickness, which indicates the growth of perovskite polycrystalline films follows normal grain growth mode.[29] In addition, the voids existed in between the adjacent crystals in the original $PbI_2$ film vanished after the formation of perovskite crystals. Interestingly, further prolonging the reaction time to 4 h does not affect the grain structure (FIG. 9D). There is no obvious observation of ripening, or coarsening process at post stage, which often appears during polycrystalline film growth.[30] This indicates a thermodynamic stable film is formed after the reaction completed at the moderate temperature. Further prolonging reaction time is out the current research scope, though.

The present VASP results in perovskite films with full surface coverage, small surface roughness, undulating nature in vertical direction in the range of length scale, and complete conversion of $PbI_2$, which addresses most crucial issues regarding perovskite thin film formation for PV applications. Remarkably different from previously reported solution process approaches, the two-step VASP exhibits its distinctiveness. In the first step, the inorganic precursors are spin-coated to form a smooth and uniform $PbI_2$ film with the surface roughness of less than 20 nm (FIG. S3). It avoids the extremely high growth rate of perovskite film that often happens in co-deposition process.[26] This film acts not only as a superior framework for the perovskite formation, but also as a reservoir of one of the reactants to provide the kinetically favorable "nucleation" centers to allow further perovskite formation. In addition, the voids appeared in the $PbI_2$ film facilitate the subsequent reaction by providing more surface area. When exposed to the $CH_3NH_3I$ vapor in the second step, intercalation reaction occurs in situ with the simultaneous polycrystalline film growth, where the specific surface and interface energy minimizing crystallographic orientations is favored. The enhanced grain size would be ascribed to the volume expansion during the transformation from $PbI_2$ to perovskite by the intercalation of $CH_3NH_3I$, as well as the rearrangement of the aggregated structure of $PbI_2$ driven by the reduction of boundary length to minimize the grain boundary energy.[30] Also, the absence of voids in the final film, which appeared in the original $PbI_2$ film, suggests that VASP promotes a re-arrangement of $PbI_2$ and/or re-organization of $PbI_2$ and $CH_3NH_3I$ via intensive diffusion during the film growth.[31,32] To be noted, VASP is especially applicable in fabricating the 3D structure thin films comparing to conventional two-step solution process. Since there is no kinetically favorable Van der Waal's gap in the $PbI_2/CH_3NH_3PbI_3$ interface where the transformation occur,[26,33] a rather long reaction time is required to transform inorganic precursors into perovskite completely. Films were often deteriorated upon long time dipping. In VASP however, the absence of solvent media and a moderate processing temperature, collectively contribute a complete reaction between $PbI_2$ and $CH_3NH_3I$ without impairing the film quality successfully.

Based on the as-formed perovskite films, photovoltaic devices are subsequently fabricated. Detailed device fabrication process is described below. The cross-sectional SEM image of the device reveals its planar architecture, where the absorber layer has been well implemented into the device with intimate contact to adjacent layers: the FTO substrate is coated with a compact layer of $TiO_2$ (~70 nm), followed by the $CH_3NH_3PbI_3$ layer (~350 nm). 2,2',7,7'-tetrakis(N,N-di-p-methoxyphenylamine)-9,9'-spirobifluorene (spiro-MeOTAD) with the thickness of ~300 nm is employed as a hole-transporting layer (HTL). The thermally evaporated silver layer (~100 nm) forms the back contact of the device.

Figure 11:
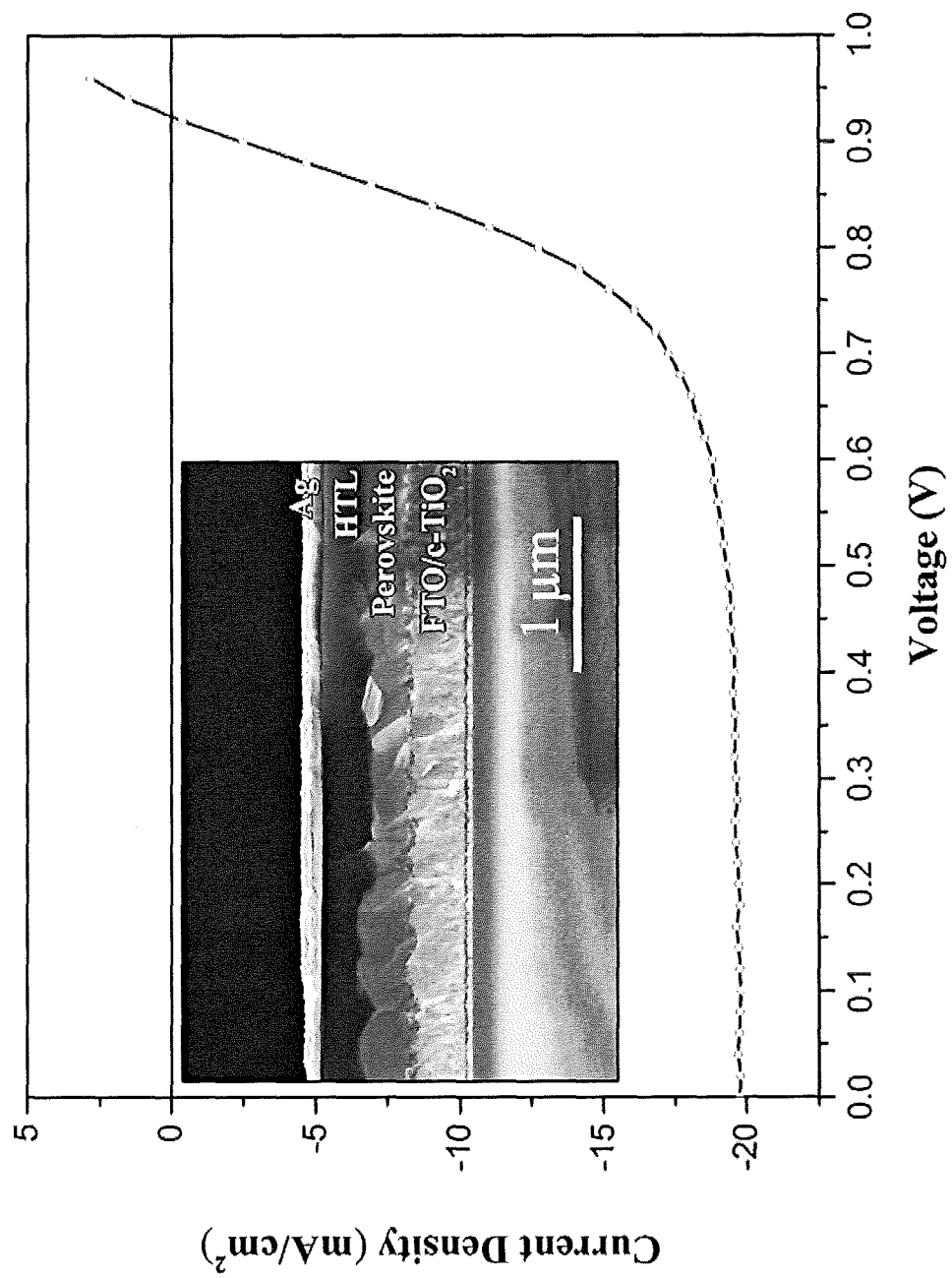
FIG. 11 shows J-V characteristics of the solar cell based on the as-prepared perovskite films under AM 1.5 G illumination, and the cross-sectional SEM image of the device (inset)
Figure 12:
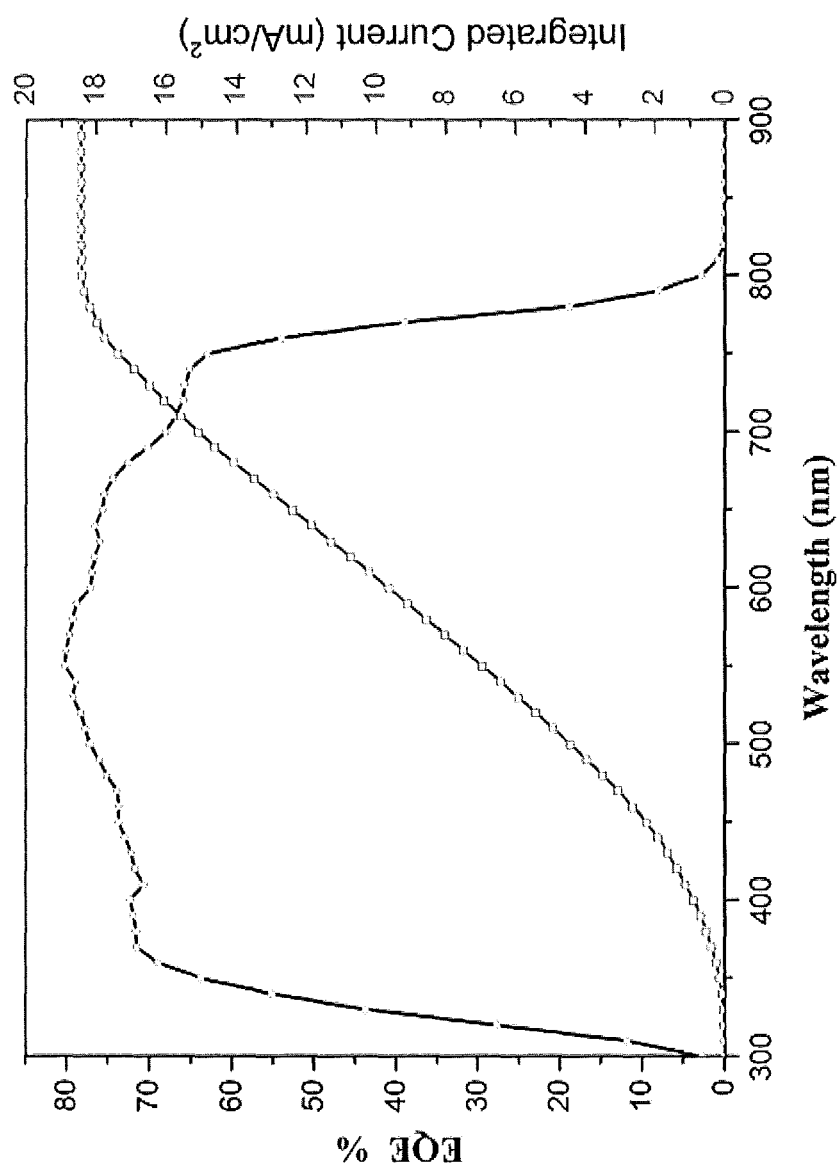
FIG. 12 shows an external quantum efficiency (EQE) spectrum (black) and the integrated photocurrent (grey) that is expected to be generated under AM 1.5 G irradiation of the device.

The corresponding device performance is conducted by current density (J)-voltage (V) measurement under simulated AM 1.5 G (100 mW/cm$^2$) solar irradiation in the air. As shown in FIG. 11, the optimum device exhibits outstanding performance with a $J_{SC}$ of 19.8 mA/cm$^2$, Voc of 0.924 V, FF of 66.3% and PCE of 12.1%, which is comparable to devices fabricated via vacuum deposition. In general, the devices exhibit open circuit voltage in the range of 0.83 to 0.94 V, short circuit current in the range of 17.3 to 20.8 mA/cm$^2$, fill factor in the range of 56.0% to 68.2%, and the resulting PCE ranging from 9.3% to 12.1%. FIG. 12 shows external quantum efficiency (EQE) spectrum for the perovskite cell. Generation of photocurrent starts at 780 nm, in agreement with the bandgap of the $CH_3NH_3PbI_3$,[9] and reaches peak values ~80% in the visible spectrum. Integrating the overlap of the EQE spectrum with the AM 1.5 G solar photon flux yields a current density of 18.5 $mA/cm^2$. One of the important factors that contribute to the high PCE is the high quality of the absorber film fabricated via VASP. The full surface coverage of this film provides more absorption to contribute the high $J_{SC}$. The large grains with reduced grain boundary, and the undulating nature in vertical direction in the range of length scale may help to alleviate surface recombination when carriers are transporting in the perovskite layer, which leads to high $V_{OC}$. The improvement of FF is largely attributed to the decrease of parasitic loss currents and the parallel resistance of the devices in this pin-hole free thin film.

By utilizing pre-formed solution processed $PbI_2$ film and the effective reaction between $PbI_2$ and $CH_3NH_3I$ in moderate temperature, VASP provides the perovskite film with grain size significantly larger than that based on vacuum deposition on non-heating substrate. Through carefully controlling the parameter of crystal growth, the grain size of the continuous film is expected to be adjusted from 200-300 nm to over 1 μm. Further study will be focused on optimizing solar cell performance by controlling the grain size of perovskite thin film, toward an enhanced optical and electrical property and consequent high performance. Besides current $CH_3NH_3PbI_3$, other inorganic-organic hybrid materials that contain low-melting point organic species, e.g. Cl/Br contained materials, or their combinations, may also be explored by simply switching the precursors. Additionally, the fabrication of other optoelectronics, such as light-emitting diode, field effect transistors, detectors may also benefit from VASP.

$CH_3NH_3I$ was synthesized by reacting 24 mL of methylamine (33 wt. % in absolute ethanol, Sigma) and 10 mL of hydroiodic acid (57 wt % in water, Aldrich) in a 250 mL round-bottom flask at 0° C. for 2 h with stirring. The precipitate was recovered by putting the solution on a rotary evaporator and carefully removing the solvents at 50° C. The yellowish raw product $CH_3NH_3I$ was re-dissolved in 80 ml absolute ethanol and precipitate with the addition of 300 ml diethyl ether. After filtration, the step was repeated again. And the solid was collected and dried at 60° C. in a vacuum oven for 24 h.

Substrate preparation was undertaken under ambient conditions. FTO-coated glass (13 Ω/sq, Aldrich) was patterned by etching with Zn powder and 2 M HCl diluted in deionized water. The substrates were then cleaned with detergent diluted in deionized water, rinsed with deionized water, acetone and ethanol, and dried with clean dry air. After oxygen plasma treatment, the clean substrates was spin-coated with 0.15 M and 0.3 M titanium diisopropoxide bis(acetylacetonate) (Aldrich) at 3,000 r.p.m. for 30 s subsequently. After drying at 125° C. for 10 min, they were sintered at 550° C. for 15 min in air. The substrate was immersed in 50 mM $TiCl_4$ (Aldrich) aqueous solutions for 30 min at 70° C. and washed with distilled water and ethanol, followed by annealing at 550° C. for 30 min in air to form a compact n-type layer of $TiO_2$(c-$TiO_2$). The solution of 400 mg/ml $PbI_2$ (Sigma) in DMF were spincoated on the FTO/c-$TiO_2$ substrates at 2,000 r.p.m. for 30 s, and dried at 110° C. for 15 min. $CH_3NH_3I$ powder was spread out around the $PbI_2$ coated substrates with a petridish covering on top, and heated at 150° C. for desired time in glovebox. After cooling down, the as-prepared substrates were washed with isopropanol, dried and annealed for 3 hours. The FTO/c-$TiO_2$/Perovskite substrates were deposited by spin-coating a HTL solution at 2000 r.p.m for 30 s, where a spiro-OMeTAD (Lumtec)/chlorobenzene (180 mg/1 ml) solution was employed with addition of 50 μl Li-bis(trifluoromethanesulfonyl) imide (Li-TFSI, Sigma)/acetonitrile (170 mg/1 ml) and 20 μl tert-butylpyridine (tBP, Sigma). Finally, the counter electrode was deposited by thermal evaporation of silver under a pressure of $5 \times 10^{-5}$ Torr. The active area was 0.12 $cm^2$.

X-ray diffraction pattern (2θ scans) were obtained from samples of perovskite deposited on the FTO/c-$TiO_2$ substrates using an X-ray diffractometer (Panalytical X'Pert Pro), using Cu—Kα radiation (λ=1.54050 Å). An emission SEM (The Nova 230 NanoSEM) was used for collecting the SEM images. The instrument uses an electron beam accelerated at 500V to 30 kV, enabling operation at a variety of currents, Atomic force microscope (AFM) was performed using Bruker Dimension 5000 Scanning Probe Microscope (SPM) in "tapping" mode. The photovoltaic performance was characterized in air without any encapsulation under an AM1.5 G filter at 100 $mW/cm^2$ using a Newport Oriel 92192 Solar Simulator, as calibrated using a certified silicon photodiode. The solar devices were masked with a metal aperture to define the active area of about 0.11 $cm^2$, and measured in a sample holder to minimize any edge effects. The external quantum efficiency (EQE) was measured using a system designed by Enli Tech.

FIGS. 10A-10C depict the cross-sectional SEM images of the $PbI_2$ film annealed at 150° C. for 0 h, 0.5 h and 4 h, respectively. As indicated in FIG. 10A, the thickness of $PbI_2$ film is ~200 nm, which is composed of several "platelets" in the vertical direction. With the reaction time prolonged to 0.5 h, the "platelets" at the top enlarged and formed well-defined grains, while those at the bottom remained the same. The film thickness increased to ~300 nm consequently. This is in the agreement of the possible growth of perovskite on top of the $PbI_2$ grains, as indicated in the manuscript. The film at post stage, where the reaction time further increase to 4 h, did not show obvious difference to that of completed stage (2 h), in terms of the grain morphology and the film thickness. The film kept the undulation characteristic of the surface, suggests the absence of distinctive ripening and coarsening process thereafter.

Figures 13A, 13B:
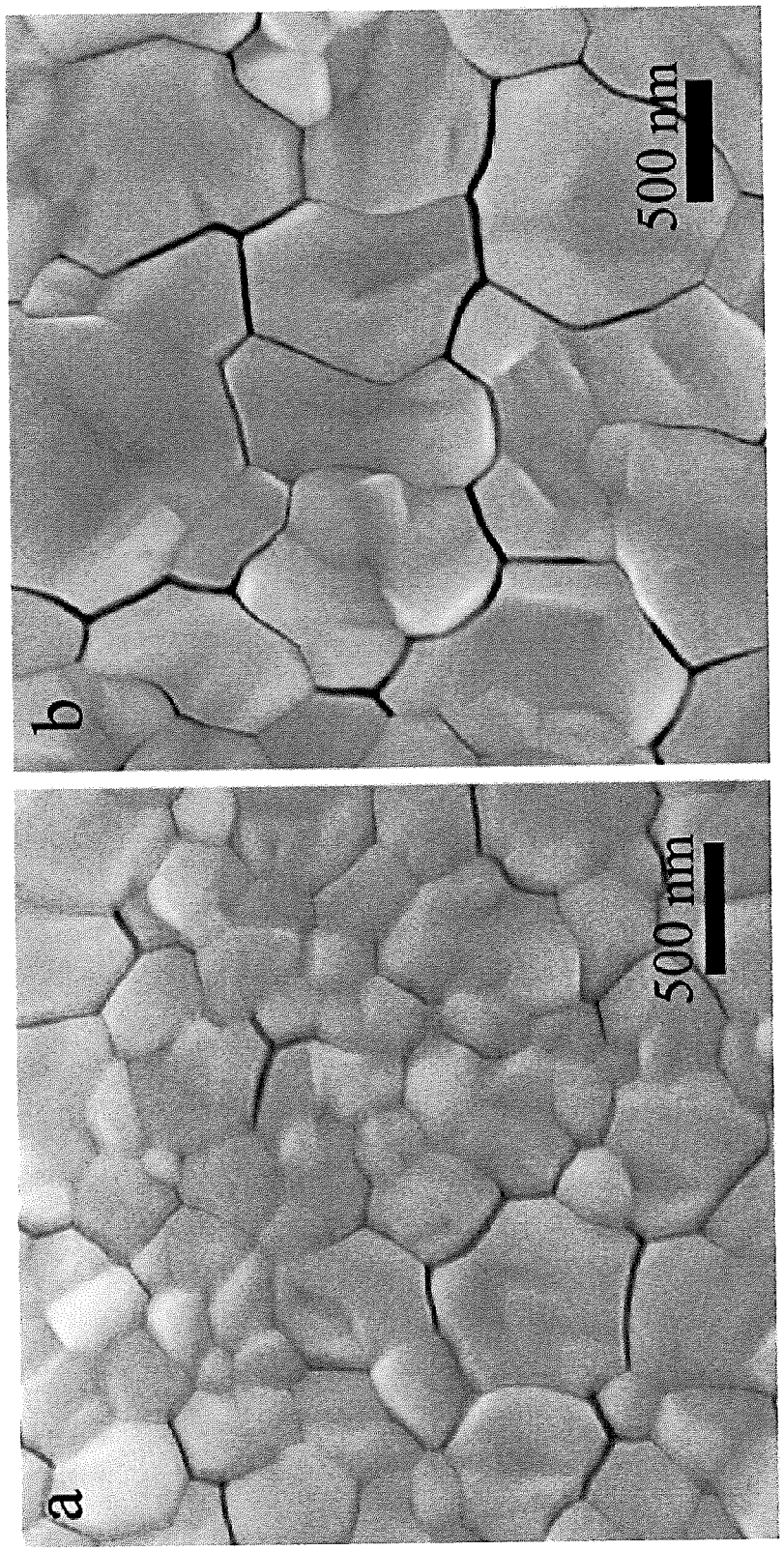
FIG. 13A shows an SEM image of the PbI₂ film annealed at 150° C. for 1 h in the presence of CH₃NH₃I.
FIG. 13B shows an SEM image of the PbI₂ film annealed at 150° C. for 3 h in the presence of CH₃NH₃I.

FIGS. 13A and 13B show top-view SEM images of the $PbI_2$ film annealed at 1 h and 3 h in the presence of $CH_3NH_3I$, respectively. It is clear that a certain amount of small grains of ~150 nm coexisted with the large grains of over 500 nm when the annealing time was 1 h (FIG. 13A). Compared with the complete stage (2 h), the existence of the relatively small grains indicates the grain growth is underway at this stage. At the post stage (3 h, FIG. 13B), it shows similar morphology as that of the reaction at 2 and 4 h. This further confirms the reaction between $PbI_2$ and $CH_3NH_3I$ is completed within 2 hours without obvious film progression thereafter.

Figure 14:
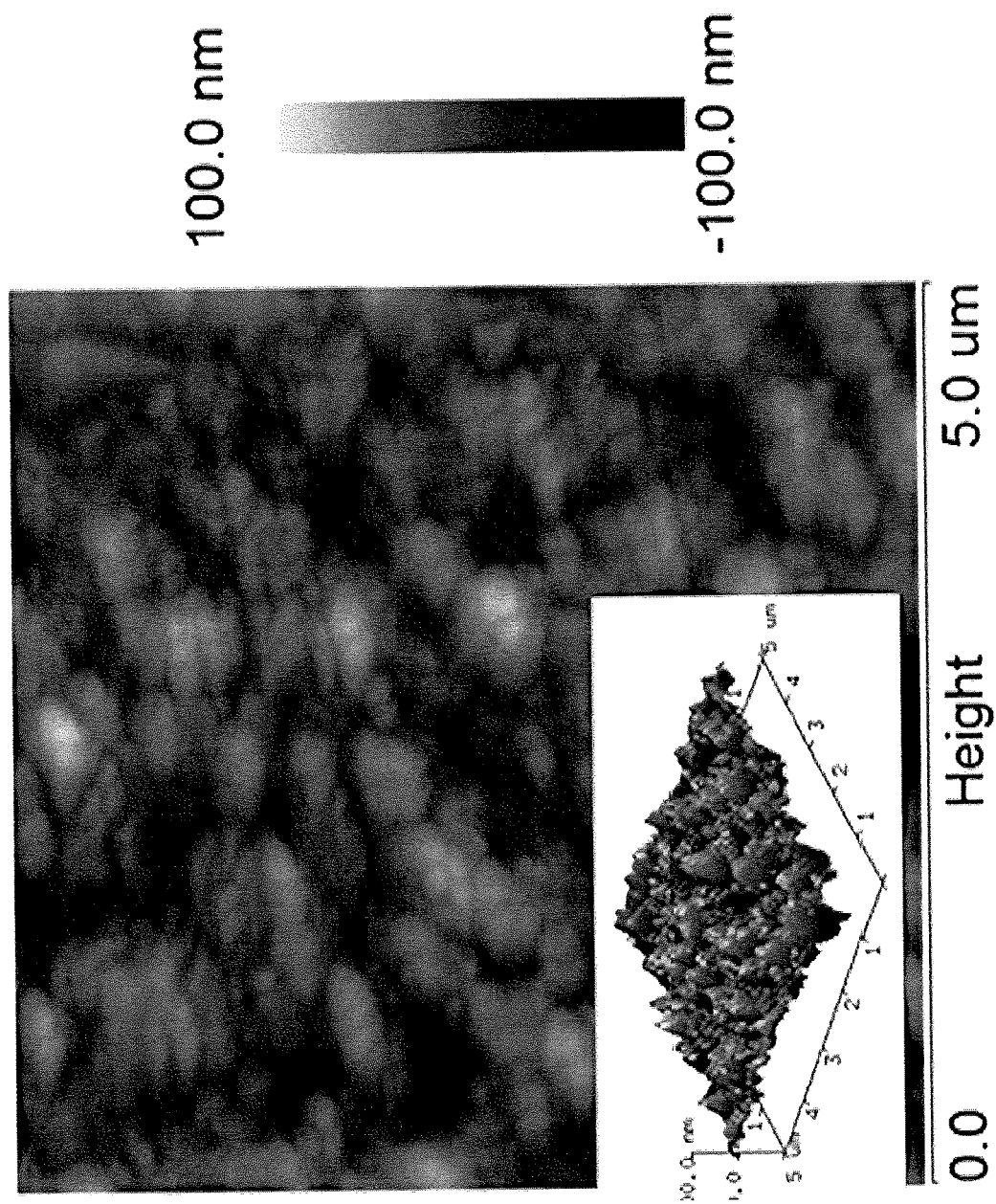
FIG. 14 shows tapping-mode AFM height images (5×5 µm) of the as-prepared PbI₂ films (inset: the corresponding 3D topographic image)

FIG. 14 shows tapping-mode AFM height images (5×5 μm) of the as-prepared $PbI_2$ films (Inset: the corresponding 3D topographic image). As indicated in FIG. 14, the $PbI_2$ film exhibits a calculated roughness of ~17 nm. The smooth film serves as a superior platform for the further growth of perovskites.

Figures 15A, 15B:
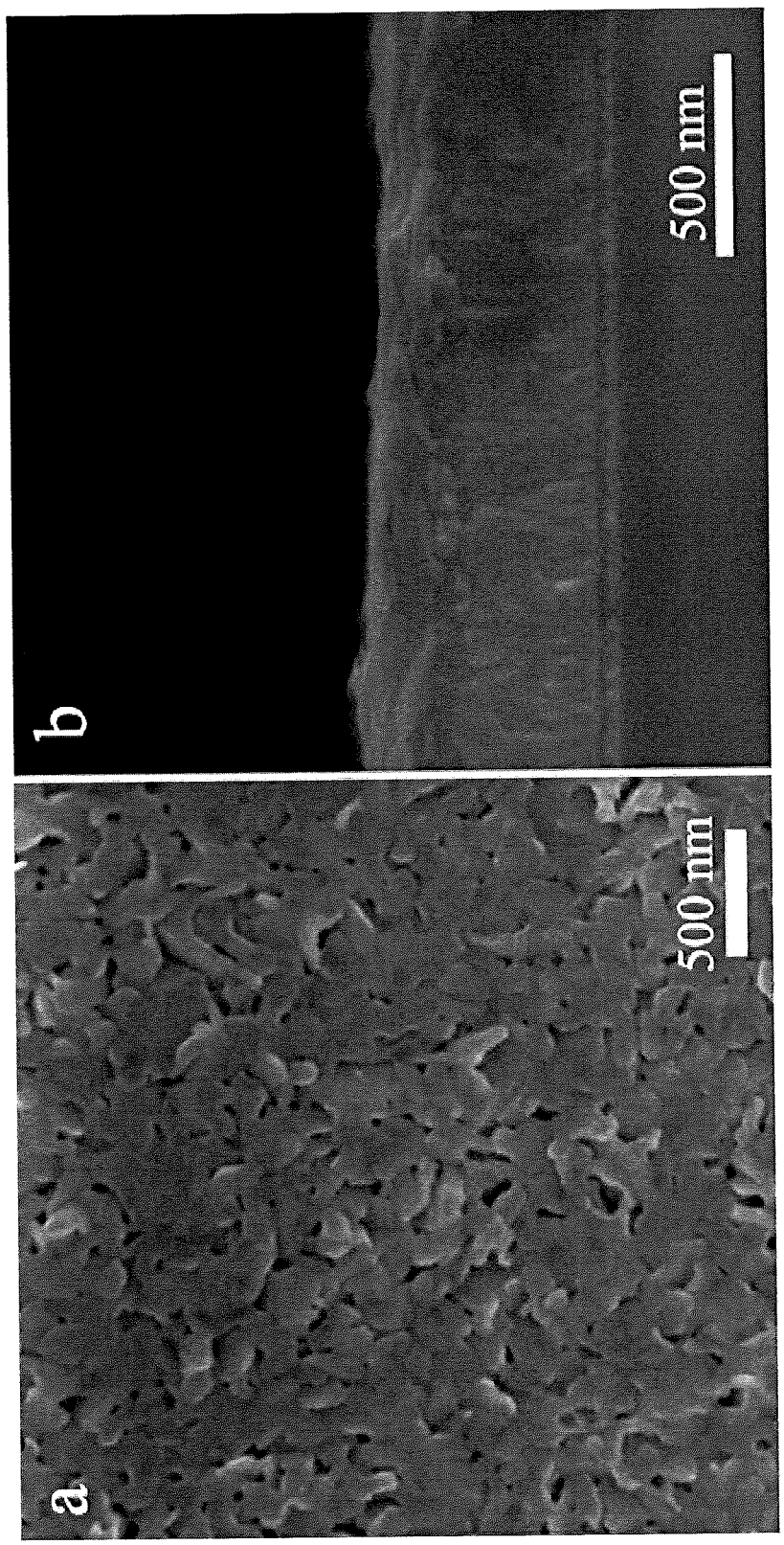
FIG. 15A shows a top-view SEM image of the PbI₂ film annealed at 150° C. for 2 h.
FIG. 15B shows a cross-sectional SEM image of the PbI₂ film annealed at 150° C. for 2 h.

FIG. 15A shows a top-view SEM image and FIG. 15B shows a cross-sectional SEM image of the $PbI_2$ film annealed at 150° C. for 2 h. As shown in FIGS. 15A and 15B, the $PbI_2$ film annealed without the involvement of $CH_3NH_3I$ exhibits similar grain size and morphology as that of the initial PbI$_2$ film. It indicates that no obvious grain growth driven by diffusion occurred within the sole PbI$_2$ film at the current temperature. In contrast, grain growth is observed within the PbI$_2$ in the presence of CH$_3$NH$_3$I, which is ascribed to 1) the intercalation induced volume expansion, or possibly 2) re-arrangement of PbI$_2$.

Figures 16A, 16B:
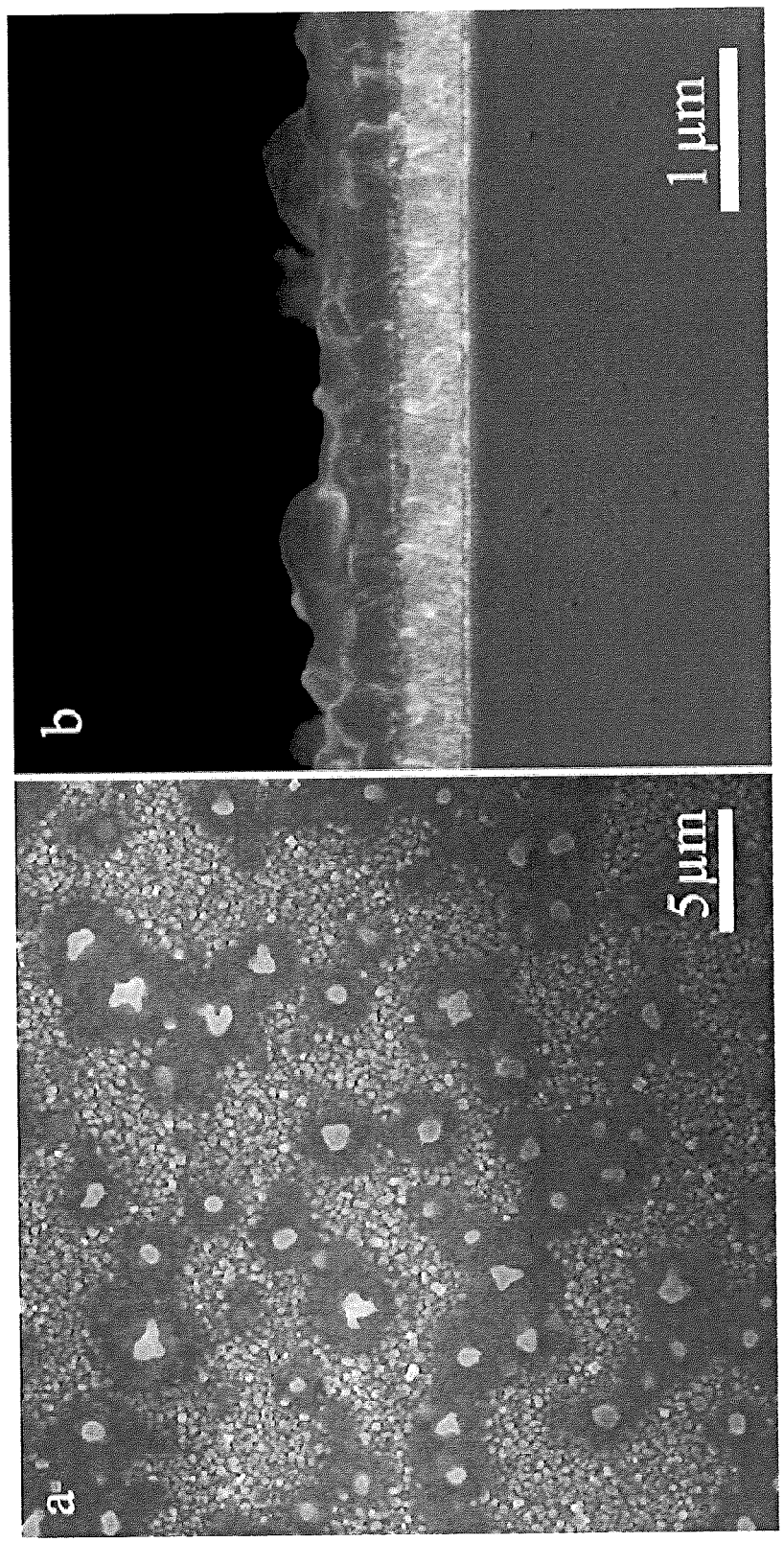
FIG. 16A shows a top-view SEM image of the PbI₂ film after dipping in the CH3NH3I IPA solution (10 mg/ml) for 30 min.
FIG. 16B shows a cross-sectional SEM image of the PbI₂ film after dipping in the CH3NH3I IPA solution (10 mg/ml) for 30 min.

A two-step process, by dipping the PbI$_2$ film in CH$_3$NH$_3$I solution (10 mg/mL), is also studied in the current work. FIGS. 16A and 16B show a top-view SEM image and a cross-sectional SEM image, respectively, of the PbI2 film after dipping in the CH$_3$NH$_3$I IPA solution (10 mg/ml) for 30 min. Both the top-view and cross-sectional SEM images indicate a rough surface of the film. As suggested by the reported results, a rather long reaction time is required to construct the 3D structured CH$_3$NH$_3$PbI$_3$ film, since there is no kinetically favorable van der wall gap in the interface of PbI$_2$/CH$_3$NH$_3$PbI$_3$ where the transformation occur. It thus results in the film with strikingly enhanced surface roughness, or ultimately film peel-off from the substrate, which hampers its application in PVs.

VASP, a novel low temperature approach to fabricate planar perovskite film and the corresponding PV devices is described herein. It is based on the kinetically favorable reaction between the as-deposited film of PbI$_2$ and CH$_3$NH$_3$I vapor. The perovskite film derived from this approach exhibits full surface coverage, uniform grain structure with grain size up to micrometers, and 100% precursor transformation completeness. A film evolution study on perovskite transformation indicates an appropriate re-arrangement of PbI$_2$ film during intercalation of CH$_3$NH$_3$I driven by the reduction of grain boundary energy. Facilitated by the excellent film quality, the CH$_3$NH$_3$PbI$_3$ materials enable an impressive device PCE of 12.1% in a planar architecture. VASP presents a controllable, and versatile approach toward the pursuit for high quality perovskite film and the resulting high performance PV devices. Incorporation of organic species into the as-deposited inorganic framework through vapor, effectively avoid the high growth rate of perovskite during co-deposition of precursors, and the possible film deterioration concern when dipping inorganic framework to organic species solution. Future work will be focused on the property investigation within the resulting film, e.g. charge transport behavior. More importantly, the continuous advance on the film engineering will enable high performance perovskite solar cells and other organic-inorganic hybrid optoelectronics.

REFERENCES

[1] Park, N.-G. *J. Phys. Chem. Lett.* 2013, 4, 2423.
[2] Snaith, H. J. *J. Phys. Chem. Lett.* 2013, 4, 3623.
[3] Burschka, J.; Pellet, N.; Moon, S.-J.; Humphry-Baker, R.; Gao, P.; Nazeeruddin, M. K.; Gratzel, M. *Nature* 2013, 499, 316.
[4] Liu, M.; Johnston, M. B.; Snaith, H. J. *Nature* 2013, 501, 395.
[5] Kagan, C.; Mitzi, D.; Dimitrakopoulos, C. *Science* 1999, 286, 945.
[6] Mitzi, D. B. *Prog. Inorg. Chem.* 2007, 48, 1.
[7] Im, J.-H.; Lee, C.-R.; Lee, J.-W.; Park, S.-W.; Park, N.-G. *Nanoscale* 2011, 3, 4088.
[8] Kojima, A.; Teshima, K.; Shirai, Y.; Miyasaka, T. *J. Am. Chem. Soc.* 2009, 131, 6050.
[9] Kim, H. S.; Lee, C. R.; Im, J. H.; Lee, K. B.; Moehl, T.; Marchioro, A.; Moon, S. J.; Humphry-Baker, R.; Yum, J. H.; Moser, J. E.; Gratzel, M.; Park, N. G. *Sci. Rep.* 2012, 2, 591.
[10] Lee, M. M.; Teuscher, J.; Miyasaka, T.; Murakami, T. N.; Snaith, H. J. *Science* 2012, 338, 643.
[11] Heo, J. H.; Im, S. H.; Noh, J. H.; Mandal, T. N.; Lim, C.-S.; Chang, J. A.; Lee, Y. H.; Kim, H.-j.; Sarkar, A.; Nazeeruddin Md, K.; Gratzel, M.; Seok, S. I. *Nat. Photon.* 2013, 7, 486.
[12] Abrusci, A.; Stranks, S. D.; Docampo, P.; Yip, H.-L.; Jen, A. K. Y.; Snaith, H. J. *Nano Lett* 2013, 13, 3124.
[13] Kim, H.-S.; Lee, J.-W.; Yantara, N.; Boix, P. P.; Kulkarni, S. A.; Mhaisalkar, S.; Grätzel, M.; Park, N.-G. *Nano Lett.* 2013, 13, 2412.
[14] Noh, J. H.; Im, S. H.; Heo, J. H.; Mandal, T. N.; Seok, S. I. *Nano Lett.* 2013, 13, 1764.
[15] Zhang, W.; Saliba, M.; Stranks, S. D.; Sun, Y.; Shi, X.; Wiesner, U.; Snaith, H. J. *Nano Lett.* 2013, 13, 4505.
[16] Stranks, S. D.; Eperon, G. E.; Grancini, G.; Menelaou, C.; Alcocer, M. J. P.; Leijtens, T.; Herz, L. M.; Petrozza, A.; Snaith, H. J. *Science* 2013, 342, 341.
[17] Xing, G.; Mathews, N.; Sun, S.; Lim, S. S.; Lam, Y. M.; Grazel, M.; Mhaisalkar, S.; Sum, T. C. *Science* 2013, 342, 344.
[18] Ball, J. M.; Lee, M. M.; Hey, A.; Snaith, H. J. *Energ. Environ. Sci.* 2013, 6, 1739.
[19] Laban, W. A.; Etgar, L. *Energ. Environ. Sci.* 2013, 6, 3249.
[20] Zhao, Y.; Zhu, K. *J. Phys. Chem. Lett.* 2013, 4, 2880.
[21] Etgar, L.; Gao, P.; Xue, Z.; Peng, Q.; Chandiran, A. K.; Liu, B.; Nazeeruddin, M. K.; Grätzel, M. *J. Am. Chem. Soc.* 2012, 134, 17396.
[22] Kim, H.-S.; Mora-Sero, I.; Gonzalez-Pedro, V.; Fabregat-Santiago, F.; Juarez-Perez, E. J.; Park, N.-G.; Bisquert, J. *Nat. Commun.* 2013, 4, 2242.
[23] Eperon, G. E.; Burlakov, V. M.; Docampo, P.; Goriely, A.; Snaith, H. J. *Adv. Func. Mater* 2013, (DOI: 10.1002/adfm.201302090).
[24] Jeng, J.-Y.; Chiang, Y.-F.; Lee, M.-H.; Peng, S.-R.; Guo, T.-F.; Chen, P.; Wen, T.-C. *Adv. Mater.* 2013, 25, 3727.
[25] Sun, S.; Salim, T.; Mathews, N.; Duchamp, M.; Boothroyd, C.; Xing, G.; Sum, T. C.; Lam, Y.-M. *Energy Environ. Sci.* 2013, 6, (DOI:10.1039/C3EE43161D).
[26] Liang, K.; Mitzi, D. B.; Prikas, M. T. *Chem. Mater.* 1998, 10, 403.
[27] Baikie, T.; Fang, Y.; Kadro, J. M.; Schreyer, M.; Wei, F.; Mhaisalkar, S. G.; Graetzel, M.; White, T. J. *J. Mater Chem. A* 2013, 1, 5628.
[28] Stoumpos, C. C.; Malliakas, C. D.; Kanatidis, M. G. *Inorg. Chem.* 2013, 52, 9019.
[29] Thompson, C. *Annu. Rev. Mater. Sci.* 2000, 30, 159.
[30] Ohring, M. The materials science of thin films; Academic Press: Boston, 1992.
[31] Era, M.; Hattori, T.; Taira, T.; Tsutsui, T. *Chem. Mater.* 1997, 9, 8.
[32] Mitzi, D. B.; Prikas, M.; Chondroudis, K. *Chem. Mater* 1999, 11, 542.
[33] Mitzi, D. B.; Dimitrakopoulos, C. D.; Rosner, J.; Medeiros, D. R.; Xu, Z.; Noyan, C. *Adv. Mater* 2002, 14, 1772.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A method of producing an organic-inorganic perovskite thin film, comprising:
    depositing a layer of inorganic material on a substrate to form an inorganic film; and
    performing an organic vapor treatment of said inorganic film to produce an organic-inorganic perovskite thin film,
    wherein said layer of inorganic material comprises an inorganic anion layer having a metal-ligand framework,
    wherein said organic vapor treatment provides organic cations capable of becoming inserted into the metal-ligand framework of the inorganic anion layer to form a perovskite structure.

2. A method of producing an organic-inorganic perovskite thin film according to claim 1, further comprising controlling a temperature of said substrate during said depositing and said performing said organic vapor treatment.

3. A method of producing an organic-inorganic perovskite thin film according to claim 1, further comprising controlling a temperature of an organic vapor for performing said organic vapor treatment.

4. A method of producing an organic-inorganic perovskite thin film according to claim 1, further comprising controlling an atmosphere for performing said organic vapor treatment.

5. A method of producing an organic-inorganic perovskite thin film according to claim 1, further comprising forming a continuous organic-inorganic perovskite thin film with up to 100% surface coverage.

6. A method of producing an organic-inorganic perovskite thin film according to claim 1, wherein said organic vapor treatment is performed with an organic component comprising a species with a low melting point.

7. A method of producing an organic-inorganic perovskite thin film according to claim 1, wherein said organic vapor treatment is performed with an organic component comprising at least one of $CH_3NH_3I$, $CH_3NH_3Br$, and $CH_3NH_3Cl$.

8. A method of producing an organic-inorganic perovskite thin film according to claim 1, wherein said organic vapor treatment is performed by spin-coating, spray-coating, dip-coating, or inkjet printing.

9. A method of producing an organic-inorganic perovskite thin film according to claim 1, wherein said substrate is a polymer.

10. A method of producing an organic-inorganic perovskite thin film according to claim 1, wherein said substrate is a flexible substrate.

11. A method of producing an organic-inorganic perovskite thin film according to claim 1, wherein said inorganic anion layer having a metal-ligand framework comprises at least one of metal halides, metal tetrafluoroborate, metal hexafluorophosphorate, and metal thiocyanate.

12. A method of producing an organic-inorganic perovskite thin film according to claim 1, further comprising incorporating said organic-inorganic perovskite thin film into an electronic or electro-optic device.

13. A method of producing an organic-inorganic perovskite thin film according to claim 1, wherein said organic vapor treatment provides organic components that diffuse into said inorganic film and convert said inorganic film into said organic-inorganic perovskite thin film in situ by chemical reactions.

14. An electronic or electro-optic device comprising:
    an organic-inorganic perovskite thin film comprising:
        a substrate;
        an inorganic component deposited on said substrate to form an inorganic thin film; and
        an organic component for treating said inorganic thin film,
    wherein said inorganic component has a metal-ligand framework, and
    wherein said organic component comprises organic cations that become inserted into said metal-ligand framework of said inorganic component to form a perovskite structure.

15. The electronic or electro-optic device according to claim 14, further comprising a first electrode and a second electrode,
    wherein said organic-inorganic perovskite thin film comprises a grain size that is at least as large as a distance between said first and second electrodes.

16. An electronic or electro-optic device according to 14, further comprising a substrate that is at least one of flexible or stretchable; metal oxide carrier transport layers; and top electrodes,
    wherein said organic-inorganic perovskite thin film, metal oxide carrier transport layers, and top electrodes were fabricated via a low temperature process.

17. An electronic or electro-optic device according to 16, wherein the organic-inorganic perovskite thin film, metal oxide carrier transport layers, and the top electrodes are transparent or semi-transparent resulting in visibly semi-transparent optoelectronic devices, such as solar cells, detectors, sensors.

18. The electronic or electro-optic device according to claim 16, wherein the organic-inorganic perovskite thin film, metal oxide carrier transport layers, and the top electrodes are transparent or semi-transparent, and wherein the electronic or electro-optic device is a radiation detector.

19. The electronic or electro-optic device according to claim 14, wherein said organic component comprises a species with a low melting point.

20. The electronic or electro-optic device according to claim 14, wherein said organic component comprises at least one of $CH_3NH_3I$, $CH_3NH_3Br$, and $CH_3NH_3Cl$.

21. The electronic or electro-optic device according to claim 14, wherein said substrate is a polymer.

22. The electronic or electro-optic device according to claim 14, wherein said substrate is a flexible substrate.

23. The electronic or electro-optic device according to claim 14, wherein said metal-ligand framework of said inorganic component comprises at least one of metal halides, metal tetrafluoroborate, metal hexafluorophosphorate, and metal thiocyanate.

* * * * *